United States Patent
Nishii et al.

[11] Patent Number: 5,942,772
[45] Date of Patent: Aug. 24, 1999

[54] SEMICONDUCTOR DEVICE AND METHOD OF MANUFACTURING THE SAME

[75] Inventors: Katsunori Nishii; Mitsuru Nishitsuji, both of Osaka; Takahiro Yokoyama, Hyogo; Akiyoshi Tamura, Osaka, all of Japan

[73] Assignee: Matsushita Electric Industrial Co., Ltd., Osaka, Japan

[21] Appl. No.: 09/044,845

[22] Filed: Mar. 20, 1998

[30] Foreign Application Priority Data

Mar. 21, 1997 [JP] Japan ................................ 9-067994
Jul. 30, 1997 [JP] Japan ................................ 9-204084

[51] Int. Cl.⁶ ............... H01L 31/0328; H01L 31/0336; H01L 31/074; H01L 31/109
[52] U.S. Cl. ........................ 257/192; 257/194; 257/195
[58] Field of Search ................. 257/192, 194, 257/195

[56] References Cited

U.S. PATENT DOCUMENTS

| 4,424,525 | 1/1984 | Mimura | 357/23 |
|---|---|---|---|
| 4,849,368 | 7/1989 | Yamashita et al. | 437/41 |
| 5,026,055 | 6/1991 | Ohata | 437/40 |
| 5,223,724 | 6/1993 | Green, Jr. | 257/194 |
| 5,493,136 | 2/1996 | Matsuzaki et al. | 257/287 |
| 5,751,027 | 5/1998 | Sawada et al. | 257/192 |

FOREIGN PATENT DOCUMENTS

| 02112239 | 4/1990 | Japan . |
|---|---|---|
| 04022140 | 1/1992 | Japan . |
| 04324645 | 11/1992 | Japan . |

*Primary Examiner*—William Mintel
*Attorney, Agent, or Firm*—McDermott, Will & Emery

[57] ABSTRACT

A heterojunction epitaxial layer, including a first semiconductor layer containing Al and having a thickness of 50 nm or less and a second semiconductor layer different in composition from the first semiconductor layer, is formed on a substrate composed of semi-insulating GaAs. A gate electrode is formed on a specified region of the top surface of the heterojunction epitaxial layer. The source/drain formation regions of the heterojunction epitaxial layer are provided with respective high-concentration N-type impurity diffusion regions, on which respective ohmic electrodes are formed.

5 Claims, 27 Drawing Sheets

HFET OF PRESENT INVENTION

CONVENTIONAL HFET

HFET OF PRESENT INVENTION

HFET WITHOUT P-TYPE EPITAXIAL LAYER

SEMICONDUCTOR DEVICE AND METHOD OF MANUFACTURING THE SAME

BACKGROUND OF THE INVENTION

The present invention relates to a semiconductor device and a method of manufacturing the same. More particularly, the present invention relates to a high-performance heterojunction field-effect transistor (HFET) with uniform electrical characteristics and a method of manufacturing the same.

Recent years have seen significant advances in the field of telecommunication. Among them are developments in portable terminal equipment represented by a mobile telephone, which has rapidly prevailed in the last few years. Since size reduction and performance enhancement are essential to a mobile telephone, a device smaller in size and higher in performance has been in increasing demand. In order to provide a mobile telephone smaller in size and higher in performance, a reduced voltage, as well as a single power source, is necessary. In the field of a mobile telephone, a power device using a positive single power source is under vigorous development so as to replace a conventional power device using positive and negative double power sources. For the purpose of implementing an operation using a positive single power source, however, a device of even higher performance is required. Although a MESFET produced by ion implantation has conventionally been prevalent as a power FET, a JFET or an HFET has recently become an alternative to the MESFET, which has substantially reached a limit of performance enhancement.

With reference to the drawings, a conventional method of manufacturing an HFET will be described. FIGS. 26 and 27 are cross-sectional views sequentially illustrating the process steps of the conventional method of manufacturing an HFET. First, as shown in FIG. 26(a), a plurality of epitaxial layers 102, which are different from each other in composition and include a heterojunction, are grown, for example, by an MOCVD method on a semi-insulating GaAs substrate 101 such that a high-concentration N-type layer is formed as the uppermost layer thereof. Then, as shown in FIG. 26(b), mesa etching is performed with respect to the epitaxial layers 102 to implement element isolation.

Next, as shown in FIG. 26(c), ohmic electrodes 103, to be source/drain electrodes, are formed in respectively specified regions on the uppermost layer of the epitaxial layers 102.

Next, as shown in FIG. 26(d), a resist pattern 104 having an opening 104a in a gate-electrode formation region is formed by photolithography. Then, as shown in FIG. 27(a), recess etching is performed with respect to the gate-electrode formation region including the uppermost layer of the epitaxial layers 102, thereby forming a recess-etched portion 102a.

Next, as shown in FIG. 27(b), a conductive film is deposited over the semi-insulating GaAs substrate 101 to be filled into the opening 104a of the resist pattern 104. A gate electrode 105 is formed after the resist pattern 104 has been lifted off, whereby the manufacturing of the HFET is completed.

However, the conventional method of manufacturing an HFET has the problem in that the electrical characteristics of the resulting HFET are seriously affected by the controllability and the uniformity of recess etching illustrated in FIG. 27(a). In a power HFET used in a mobile telephone, for example, the threshold voltage Vth, representing the characteristics of the FET, should be regulated at −0.2±0.1 V. This indicates that the depth of the recess-etched portion 102 should be controlled with a tolerance of ±1 nm. However, it is extremely difficult to control the depth with a tolerance of ±1 nm across the surface of a wafer by recess etching based on wet-etching technology used commonly at present.

SUMMARY OF THE INVENTION

It is therefore an objective of the present invention to overcome the conventional problems and provide a high-performance HFET with stabile uniform electrical characteristics.

In order to attain this objective, the present invention performs ion implantation and plasma processing, not recess etching, with respect to a heterojunction epitaxial layer, thereby forming high-concentration N-type impurity diffusion regions having a reduced sheet resistance in the heterojunction epitaxial layer.

A semiconductor device according to the present invention includes: a heterojunction epitaxial layer formed on a substrate; a gate electrode of a refractory metal formed on the heterojunction epitaxial layer; and high-concentration impurity diffusion regions formed in the heterojunction epitaxial layer. The high-concentration impurity diffusion regions are spaced along the length of the gate electrode. The heterojunction epitaxial layer includes: a first semiconductor layer containing aluminum and having a thickness of 50 nm or less; and a second semiconductor layer different in composition from the first semiconductor layer.

In general, a Group III-V compound semiconductor causes numerous crystalline defects if it contains aluminum and therefore has a high sheet resistance because N-type impurity ions are activated to a smaller degree. In the semiconductor device according to the present invention, however, the thickness of the first semiconductor layer, which contains aluminum and is used as a carrier supplying layer or a barrier layer owing to a wide band gap, is 50 nm or less. Thus, the volume ratio of the first semiconductor layer to the high-concentration impurity diffusion region is relatively low, resulting in reduction of the sheet resistance of the overall high-concentration impurity diffusion regions.

Moreover, since the gate electrode formed on the heterojunction epitaxial layer has no recessed portion, variations in threshold voltage can be restricted to the variations specific to the heterojunction epitaxial layer. As a result, controllability of the threshold voltage is improved.

Preferably, the semiconductor device according to the present invention further includes a P-type epitaxial layer formed between the heterojunction epitaxial layer and the gate electrode. In such a case, the N-type semiconductor layer, such as the carrier supplying layer, typically included in the heterojunction epitaxial layer and the P-type epitaxial layer form a P-N junction, which increases the height of a barrier resulting from Schottky contact between the gate electrode and the heterojunction epitaxial layer. Accordingly, a voltage having a higher positive value due to the increased height of the barrier can be used and an operation using a single positive power source can be performed without using a negative power source. In the semiconductor device according to the present invention, the substrate is preferably a semi-insulating GaAs substrate, the first semiconductor layer preferably includes a carrier supplying layer composed of N-type AlGaAs, and the second semiconductor layer preferably includes a well layer containing non-doped GaAs. This ensures the production of a heterojunction FET with uniform electrical characteristics.

In the semiconductor device according to the present invention, the substrate is preferably a semi-insulating InP substrate or a semi-insulating GaAs substrate, the first semiconductor layer preferably includes a carrier supplying layer composed of N-type InAlAs, and the second semiconductor layer preferably includes a well layer containing non-doped GaAs. This ensures the production of a heterojunction FET with hardly varying electrical characteristics.

The first method of manufacturing a semiconductor device according to the present invention includes: an epitaxial layer forming step of forming a heterojunction epitaxial layer on a substrate, the heterojunction epitaxial layer including a first semiconductor layer containing aluminum and having a thickness of 50 nm or less, and a second semiconductor layer different in composition from the first semiconductor layer; a gate-electrode forming step of selectively forming a gate electrode of a refractory metal on the heterojunction epitaxial layer; an impurity-diffusion-region forming step of implanting N-type impurity ions into the heterojunction epitaxial layer masked with the gate electrode and conducting prescribed annealing with respect to the heterojunction epitaxial layer so as to form, by self alignment, high-concentration N-type impurity diffusion regions in the heterojunction epitaxial layer; and an ohmic-electrode forming step of forming respective ohmic electrodes on the high-concentration N-type impurity diffusion regions.

In accordance with the first method of manufacturing a semiconductor device, after the heterojunction epitaxial layer, including the first semiconductor layer containing aluminum and having a thickness of 50 nm or less and the second semiconductor layer different in composition from the first semiconductor layer, has been formed, the N-type impurity ions are implanted and prescribed annealing are performed with respect to the heterojunction epitaxial layer masked with the gate electrode formed thereon. As a result, the high-concentration N-type impurity diffusion regions are formed by self alignment with respect to the heterojunction epitaxial layer. In such a case, since the thickness of the first semiconductor layer containing aluminum and forming the carrier supplying layer in the heterojunction epitaxial layer is 50 nm or less, the volume ratio of the first semiconductor layer, in which a sheet resistance is less likely to decrease, to the high-concentration impurity diffusion regions is reduced. As a result, the sheet resistance of the overall high-concentration impurity diffusion regions is reduced. Moreover, since the high-concentration impurity diffusion regions are formed by self alignment with respect to the heterojunction epitaxial layer masked with the gate electrode, the high-concentration impurity diffusion region is formed between the gate and source electrodes as well, which ensures a reduction in source resistance.

Furthermore, since the gate-electrode forming step does not involve recess etching, variations in threshold voltage can be restricted to the variations specific to the heterojunction epitaxial layer, which improves the controllability of the threshold voltage.

In the first method of manufacturing a semiconductor device, the epitaxial-layer forming step preferably includes the step of forming a P-type epitaxial layer on the top surface of the heterojunction epitaxial layer. Since the gate electrode has thus been formed on the P-type epitaxial layer in the gate-electrode forming step, the N-type semiconductor layer, such as the carrier supplying layer, typically included in the heterojunction epitaxial layer and the P-type epitaxial layer form a P-N junction, which increases the height of a barrier resulting from Schottky contact between the gate electrode and the heterojunction epitaxial layer. Accordingly, a voltage having a higher positive value due to the increased height of the barrier can be used and an operation using a single positive power source can be performed without using a negative power source.

In the first method of manufacturing a semiconductor device, the substrate is preferably a semi-insulating GaAs substrate, the first semiconductor layer preferably includes a carrier supplying layer composed of N-type AlGaAs, and the second semiconductor layer preferably includes a well layer containing non-doped GaAs. This ensures the production of a heterojunction FET with uniform electrical characteristics.

In the first method of manufacturing a semiconductor device, the substrate is preferably a semi-insulating InP substrate or a semi-insulating GaAs substrate, the first semiconductor layer preferably includes a carrier supplying layer composed of N-type. InAlAs, and the second semiconductor layer preferably includes a well layer containing non-doped GaAs. This ensures the production of a heterojunction FET with hardly varying electrical characteristics.

The second method of manufacturing a semiconductor device according to the present invention includes: an epitaxial-layer forming step of forming a heterojunction epitaxial layer on a substrate, the heterojunction epitaxial layer including a first semiconductor layer containing aluminum and a second semiconductor layer different in composition from the first semiconductor layer; a gate-electrode forming step of selectively forming a gate electrode of a refractory metal on the heterojunction epitaxial layer; an impurity-diffusion-region forming step of co-implanting N-type impurity ions supplying carriers with inert ions not supplying carriers in the heterojunction epitaxial layer masked with the gate electrode and conducting prescribed annealing with respect to the heterojunction epitaxial layer so as to form, by self alignment, high-concentration N-type impurity diffusion regions in the heterojunction epitaxial layer; and an ohmic-electrode forming step of forming respective ohmic electrodes in the high-concentration N-type impurity diffusion regions.

In accordance with the second method of manufacturing a semiconductor device, after the heterojunction epitaxial layer including the first semiconductor layer containing aluminum and the second semiconductor layer different in composition from the first semiconductor layer have been formed, the N-type impurity ions and the inert ions are simultaneously implanted and prescribed annealing is performed with respect to the heterojunction epitaxial layer masked with the gate electrode formed thereon. As a result, the high-concentration N-type impurity diffusion regions are formed by self alignment with respect to the heterojunction epitaxial layer. The interaction of the inert ions on the N-type impurity ions increases the degree to which the N-type impurity ions are activated in the heterojunction epitaxial layer. Thus, the sheet resistance is reduced in the high-concentration impurity diffusion regions. Moreover, since the high-concentration impurity diffusion regions are formed by self alignment with respect to the heterojunction epitaxial layer masked with the gate electrode, the high-concentration impurity diffusion region is formed between the gate and source electrodes as well, which ensures a reduction in source resistance.

Furthermore, since the gate-electrode forming step does not involve recess etching, variations in threshold voltage can be restricted to the variations specific to the heterojunction epitaxial layer, which improves the controllability of the threshold voltage.

The third method of manufacturing a semiconductor device according to the present invention includes: an epitaxial-layer forming step of forming a heterojunction epitaxial layer on a substrate, the heterojunction epitaxial layer including a first semiconductor layer containing aluminum and a second semiconductor layer different in composition from the first semiconductor layer; a gate-electrode forming step of selectively forming a gate electrode of a refractory metal on the heterojunction epitaxial layer; an impurity-diffusion-region forming step of performing plasma processing with respect to the heterojunction epitaxial layer masked with the gate electrode and conducting prescribed annealing with respect to the heterojunction epitaxial layer so as to form, by self alignment, high-concentration N-type impurity diffusion regions in the heterojunction epitaxial layer; and an ohmic-electrode forming step of forming respective ohmic electrodes on the high-concentration N-type impurity diffusion regions.

In accordance with the third method of manufacturing a semiconductor device, after the heterojunction epitaxial layer including the first semiconductor layer containing aluminum and the second semiconductor layer different in composition from the first semiconductor layer have been formed, plasma processing and prescribed annealing are performed with respect to the heterojunction epitaxial layer masked with the gate electrode formed thereon. As a result, the high-concentration N-type impurity diffusion regions are formed by self alignment with respect to the heterojunction epitaxial layer. This increases the degree to which the N-type impurity ions are activated in the heterojunction epitaxial layer and reduces the sheet resistance of the high-concentration impurity diffusion regions. Moreover, since the high-concentration impurity diffusion regions are formed by self alignment with respect to the heterojunction epitaxial layer masked with the gate electrode, the high-concentration impurity diffusion region is formed between the gate and source electrodes as well, which ensures a reduction in source resistance.

Furthermore, since the gate-electrode forming step does not involve recess etching, variations in threshold voltage can be restricted to the variations specific to the heterojunction epitaxial layer, which improves the controllability of the threshold voltage.

In the second and third methods of manufacturing a semiconductor device, the first semiconductor layer preferably has a thickness of 50 nm or less. This minimizes the film thickness of the first semiconductor layer which contains aluminum and hence reduces the degree to which impurity ions are activated. As a result, the sheet resistance of the high-concentration N-type impurity diffusion regions is reduced with more certainty.

BRIEF DESCRIPTION OF THE DRAWINGS

FIG. 22(a) is a graph showing drain current and transconductance each plotted against a gate-to-source voltage in a semiconductor device in which no P-type epitaxial layer is provided under a gate electrode.

DETAILED DESCRIPTION OF THE INVENTION

Embodiment 1

Hereinafter, the first embodiment of the present invention will be described with reference to the drawings.

Figure 1:
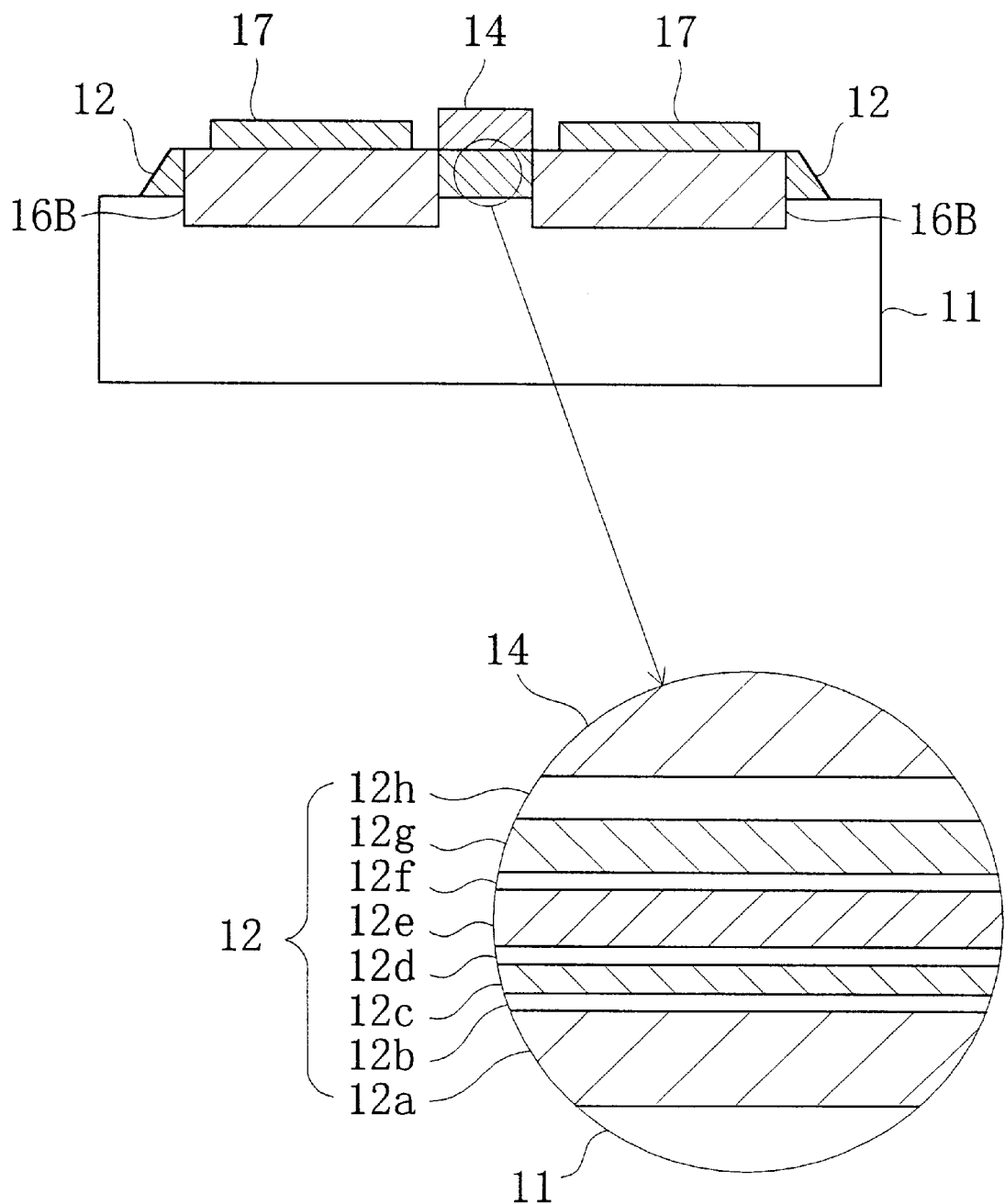
FIG. 1 shows the cross-sectional structure of a semiconductor device in the first embodiment of the present invention.

FIG. 1 shows a cross-sectional structure of a semiconductor device in the first embodiment. In FIG. 1, a heterojunction epitaxial layer 12, including a first semiconductor layer containing Al and having a thickness of 50 nm or less and a second semiconductor layer different in composition from the first semiconductor layer, is formed on a substrate 11 composed of semi-insulating GaAs. A gate electrode 14 is formed in a specified region of the top surface of the heterojunction epitaxial layer 12. High-concentration N-type impurity diffusion regions 16B are formed in the source/drain formation regions, respectively. Ohmic electrodes 17 are formed on the respective high-concentration N-type regions 16B. These components constitute an HFET.

The heterojunction epitaxial layer 12 shown In FIG. 1 includes, for example: a buffer layer 12a composed of GaAs with a thickness of 200 nm; a first spacer layer 12b composed of non-doped AlGaAs with a thickness of 2 nm; a first carrier supplying layer 12c composed of N-type AlGaAs with a thickness of 5 nm; a second spacer layer 12d composed of non-doped AlGaAs with a thickness of 2 nm; a well layer 12e composed of non-doped InGaAs with a thickness of 15 nm; a third spacer layer 12f composed of non-doped AlGaAs with a thickness of 2 nm; a second carrier supplying layer 12g composed of N-type AlGaAs with a thickness of 7 nm; and a fourth spacer layer 12h composed of non-doped GaAs with a thickness of 5 nm. All these layers are formed sequentially on the substrate 11 as shown in the enlarged view showing, on a larger scale, a region under the gate electrode 14.

The first semiconductor layer containing aluminum and having a thickness of 50 nm or less is constituted by the first spacer layer 12b, the first carrier supplying layer 12c, the second spacer layer 12d, the third spacer layer 12f, and the second carrier supplying layer 12g. The second semiconductor layer is constituted at least by the well layer 12e among the buffer layer 12a, the well layer 12e, and the fourth spacer layer 12h.

In the HFET, the first carrier supplying layer 12c, composed of N-type AlGaAs, is formed under the second spacer layer 12d, which is composed of non-doped AlGaAs and underlies the well layer 12e composed of non-doped InGaAs. On the other hand, the second carrier supplying layer 12g, composed of N-type AlGaAs, is formed over the third spacer layer 12f, which is composed of non-doped AlGaAs and overlies the well layer 12e. As a result, a double heterojunction is formed. Since the well layer 12e has a lower energy level than that of the first and the second carrier supplying layers 12c and 12g, carriers (electrons) flowing from the first and the second carrier supplying layers 12c and 12g into the well layer 12e can be confined in the well layer 12e. Therefore, the acceleration of the carriers with the application of a drain bias voltage enables the carriers to drift at a high speed. The second and the third spacer layers 12d and 12f are provided to prevent the carriers drifting in the well layer 12e from being affected by impurity ions contained in the first and the second carrier supplying layers 12c and 12g.

In general, since the threshold voltage Vth of the HFET is determined by the heterojunction epitaxial layer 12, the controllability of the threshold voltage Vth and the uniformity thereof across the surface of a wafer are determined by the epitaxial substrate itself. Since conventional recess etching is performed with respect to the gate-electrode formation region of the HFET in this embodiment, variations in threshold voltage Vth can be restricted to the variations specific to the epitaxial substrate.

Hereinafter, a method of manufacturing the semiconductor device in the first embodiment will be described with reference to the drawings.

Figure 2A:
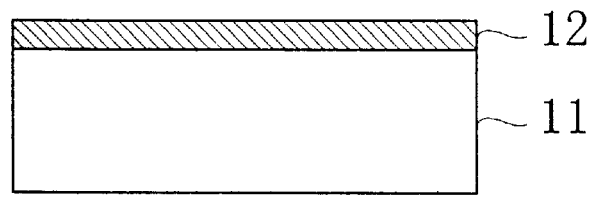
FIGS. 2(a) to 2(d) are cross-sectional views sequentially illustrating the process steps for manufacturing a semiconductor device in the first embodiment.

FIGS. 2(a) to 2(d) and FIGS. 3(a) and 3(b) show cross-sectional structures sequentially illustrating the process steps of the method of manufacturing a semiconductor device in the first embodiment. First, as shown in FIG. 2(a), the buffer layer composed of GaAs with a thickness of 200 nm, the first spacer layer composed of non-doped AlGaAs with a thickness of 2 nm, the first carrier supplying layer composed of N-type AlGaAs with a thickness of 5 nm, the second spacer layer composed of non-doped AlGaAs with a thickness of 2 nm, the well layer composed of non-doped InGaAs with a thickness of 15 nm, the third spacer layer composed of non-doped AlGaAs with a thickness of 2 nm, the second carrier supplying layer composed of N-type AlGaAs with a thickness of 7 nm, and the fourth spacer layer composed of non-doped GaAs with a thickness of 5 nm are grown sequentially on the substrate 11 composed of semi-insulating GaAs, for example, by an MOCVD method, thereby forming the heterojunction epitaxial layer 12.

Figure 2B:
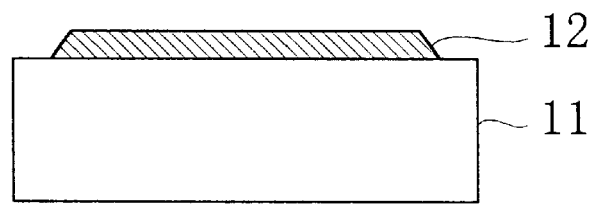
Figure 2C:
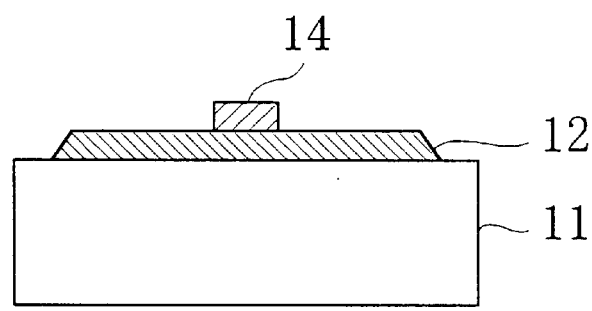

Next, as shown in FIG. 2(b), mesa etching is performed with respect to the heterojunction epitaxial layer 12 to implement element isolation. Then, as shown in FIG. 2(c), a gate electrode 14 composed of a refractory metal WSi, which can withstand an annealing process performed in the subsequent step, is formed in a specified region on the top surface of the heterojunction epitaxial layer 12.

Figure 2D:
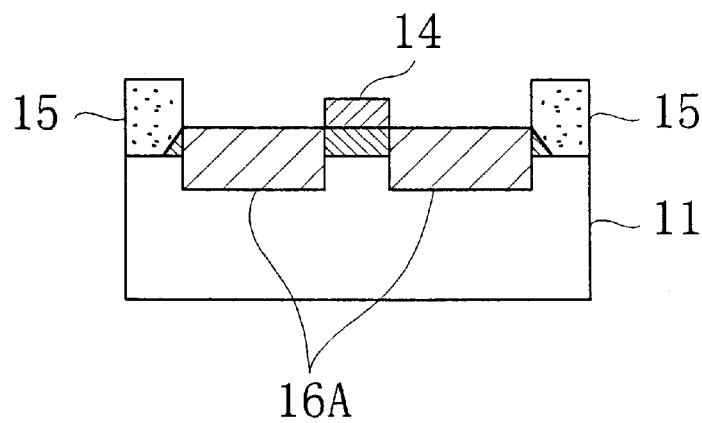

Next, as shown in FIG. 2(d), a resist pattern 15 for masking isolation regions is formed by photolithography.

Then, N-type impurity ions, such as Si (silicon) ions, are implanted at a dose of $5.0 \times 10^{13}$ cm$^{-2}$ and with acceleration energy of 50 keV into the substrate 11 and into the heterojunction epitaxial layer 12 by using the resist pattern 15 and the gate electrode 14 as a mask. As a result, ion-implanted regions 16A are formed.

Figure 3A:
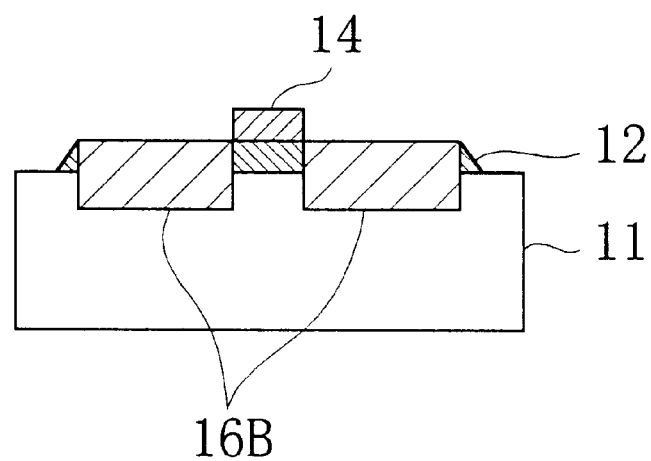
FIGS. 3(a) and 3(b) are cross-sectional views sequentially illustrating the process steps for manufacturing a semiconductor device in the first embodiment.

Next, as shown in FIG. 3(a), the resist pattern 15 is removed and a silicon oxide film (not shown) as a protective film against annealing is deposited over the entire surface of the substrate 11. Thereafter, hot-plate annealing is conducted at a temperature of 750° C. for 30 seconds in an environment of nitrogen so as to activate the ion-implanted regions 16A. High-concentration N-type regions 16B are formed in this manner.

Figure 3B:
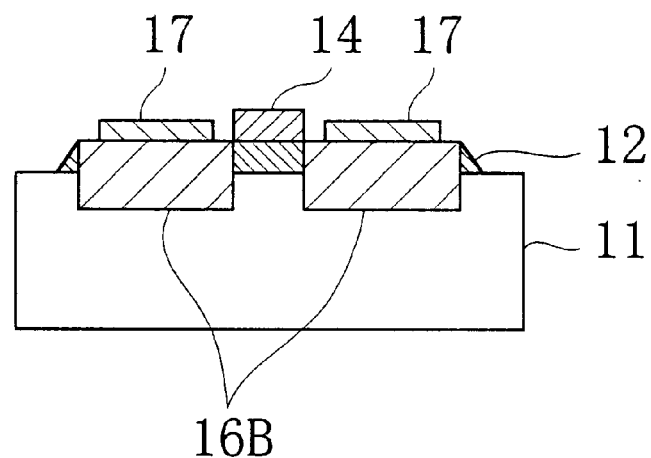

Next, as shown in FIG. 3(b), the protective film is removed and the ohmic electrodes 17, to be source/drain electrodes, are formed selectively on the high-concentration N-type regions 16B of the heterojunction epitaxial layer 12, whereby the manufacturing of the HFET is completed.

Figure 4A:
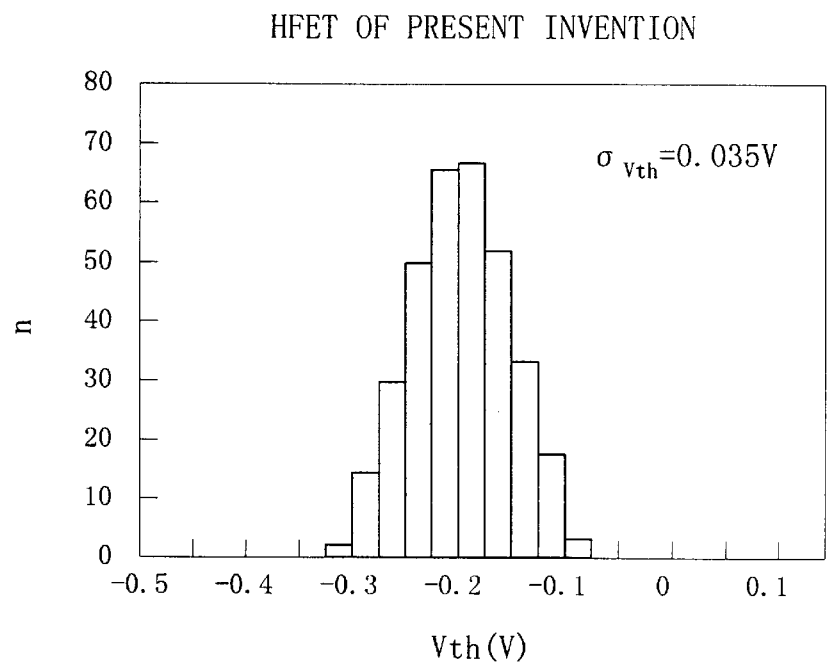
FIG. 4(a) shows the distribution of the threshold voltages of HFETs manufactured by the method of manufacturing a semiconductor device in the first embodiment.
Figure 4B:
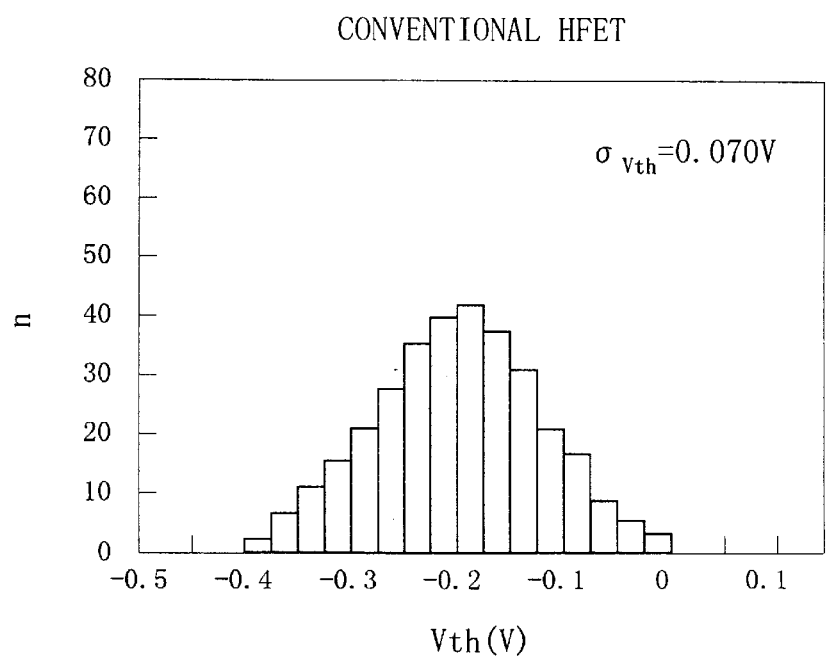
FIG. 4(b) shows the distribution of the threshold voltages of HFETs manufactured by a conventional method.

FIGS. 4(a) and 4(b) show the results of measuring the threshold voltages Vth of HFETs on the surfaces of 3-inch wafers. FIG. 4(a) shows the distribution of the threshold voltages Vth of the HFETs manufactured by the method of this embodiment and FIG. 4(b) shows the distribution of the threshold voltages Vth of the HFETs manufactured by using a conventional process. In each of these graphs, the axis of abscissas represents a threshold voltage and the axis of ordinates represents the number n of samples. The standard deviation σ of the threshold voltages Vth of the HFETs manufactured by the method of this embodiment is 0.035 V, as shown in FIG. 4(a). The standard deviation σ of the threshold voltages Vth of the HFETs manufactured by the conventional process is 0.070 V, as shown in FIG. 4(b). From the results of measurement, it can be understood that the threshold voltages Vth of the HFETs manufactured by the method of this embodiment have reduced variations.

The present embodiment is characterized by the high-concentration N-type regions 16B formed by self alignment with respect to the gate electrode 14 as shown in FIG. 3(a). Thus, the epitaxial structure is not destroyed in the region of the heterojunction epitaxial layer 12 underlying the gate electrode 14 and the region of the heterojunction epitaxial layer 12 located between the source region and the gate electrode 14 is included in the high-concentration N-type region 16B. As a result, the source resistance (parasitic resistance) is reduced and the performance of the HFET can be enhanced.

Figure 5:
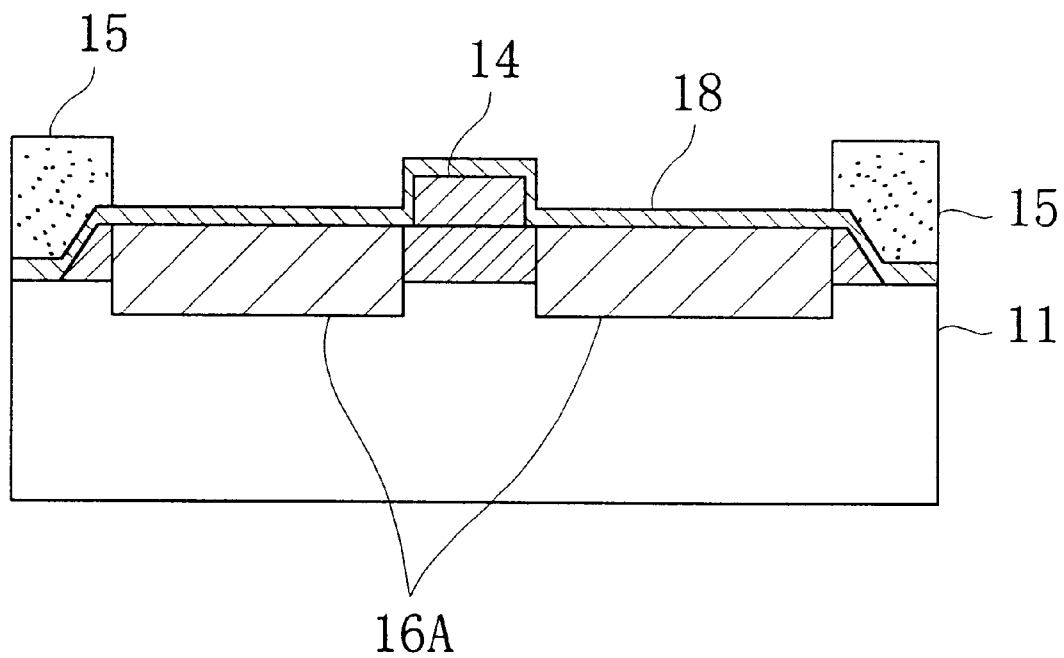
FIG. 5 is a cross-sectional view illustrating a process step for manufacturing a semiconductor device in the first embodiment.

As shown in FIG. 5, if ions are implanted into the heterojunction epitaxial layer 12 through an insulating film 18 deposited after the process step shown in FIG. 2(c) has been performed, the gap between each side of the gate electrode 14 and the ion-implanted region 16A adjacent thereto can be increased. As a result, a Schottky breakdown voltage can be increased.

Figure 6A:
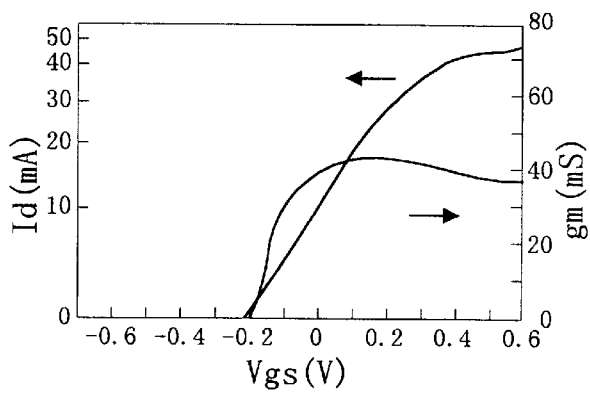
FIG. 6(a) is a graph showing drain current and transconductance each plotted against a gate-to-source voltage in the semiconductor device in the first embodiment.
Figure 6B:
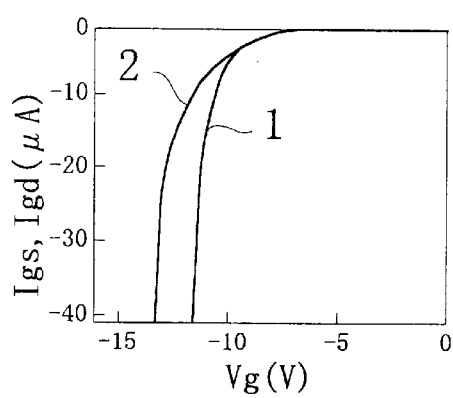
FIG. 6(b) is a graph showing gate-to-source current and gate-to-drain current each plotted against a gate voltage in the semiconductor device in the first embodiment.
Figure 6C:
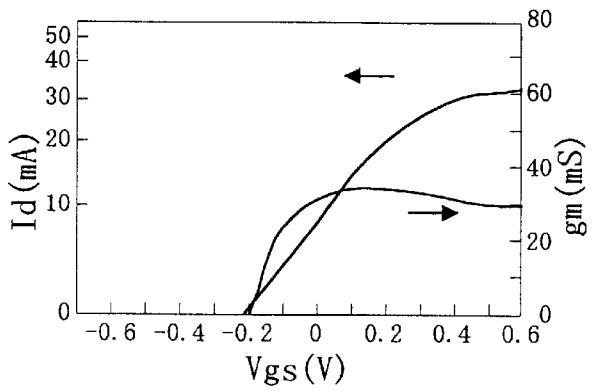
FIG. 6(c) is a graph showing drain current and transconductance each plotted against a gate-to-source voltage in a conventional semiconductor device.
Figure 6D:
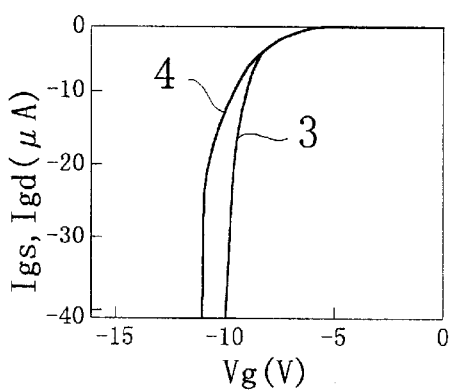
FIG. 6(d) is a graph showing gate-to-source current and gate-to-drain current each plotted against the gate voltage in the conventional semiconductor device.

FIGS. 6(a) to 6(d) show the electrical characteristics of the HFET. FIG. 6(a) shows drain current Id and transconductance gm each plotted against a gate-to-source voltage Vgs in the HFET of this embodiment. FIG. 6(b) shows gate-to-source current Igs (identified by the reference numeral 1) and gate-to-drain current Igd (identified by the reference numeral 2) each plotted against a gate voltage Vg in the HFET of this embodiment. FIG. 6(c) shows drain current Id and transconductance gm each plotted against a gate-to-source voltage Vgs in the HFET manufactured by a conventional process. FIG. 6(d) shows gate-to-source current Igs (identified by the reference numeral 3) and gate-to-drain current Igd (identified by the reference numeral 4) each plotted against the HFET manufactured by the conventional process. From the value K (gradient of the drain current) and transconductance gm of the HFET of this embodiment shown in FIG. 6(a), which are larger than those of the conventional HFET shown in FIG. 6(c), and from the absolute value of the maximum withstand reverse bias of the HFET of this embodiment shown in a FIG. 6(b), which is larger than that of the conventional HFET shown in FIG. 6(d), it will be understood that the HFET of this embodiment has higher performance than that of the conventional HFET.

Figure 7:
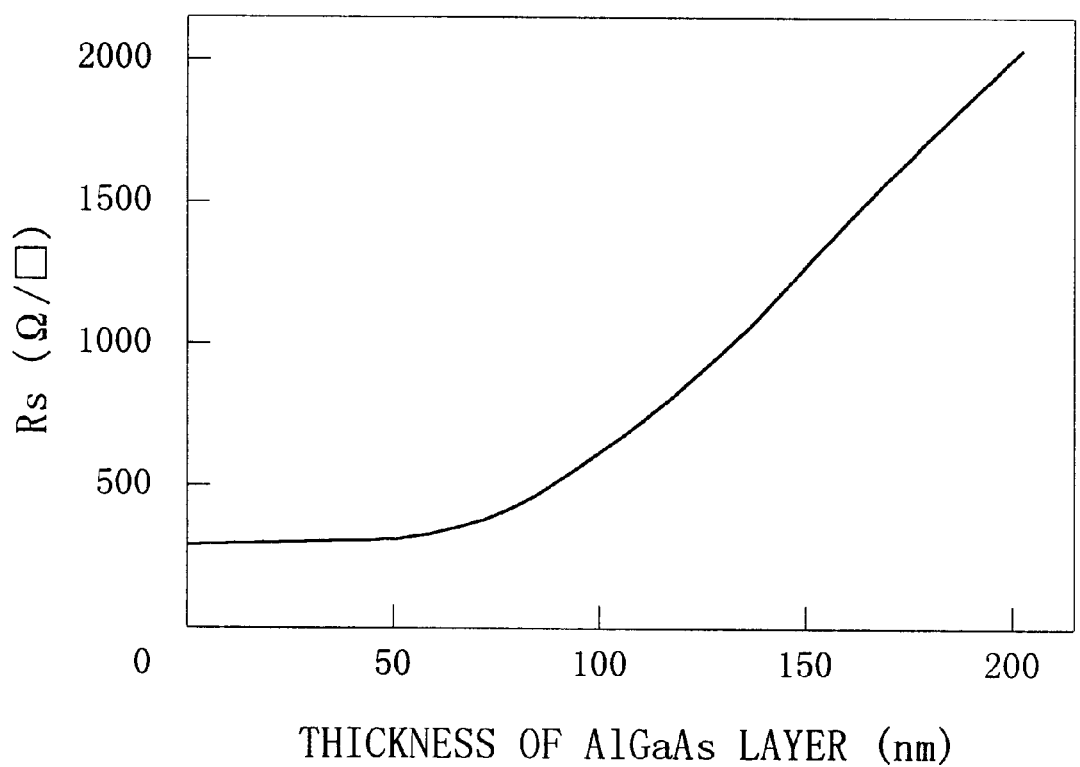
FIG. 7 is a graph showing sheet resistance plotted against the total film thickness of an AlGaAs layer composing a heterojunction epitaxial layer in the semiconductor device in the first embodiment.

In this embodiment, the total film thickness of the AlGaAs layers composing the heterojunction epitaxial layer 12 is adjusted at 18 nm. In general, the degree of activation of ions implanted in the epitaxial layer by using an ion-implantation technique is largely dependent on the film thickness of an AlGaAs layer. FIG. 7 shows the relationship between the total film thickness of AlGaAs layers and sheet resistance Rs in the HFET of this embodiment manufactured by varying the film thickness of the first spacer layer 12b composed of AlGaAs over the buffer layer 12a in the heterojunction epitaxial layer 12 under the implanting and annealing conditions described above. As shown in FIG. 7, the value of sheet resistance Rs is 280 Ω/□ when the total film thickness of the AlGaAs layers is 18 nm. However, the value of sheet resistance Rs increases abruptly when the total film thickness of the AlGaAs layers exceeds 50 nm. The value of sheet resistance Rs is as high as 2kΩ/□ when the total film thickness of the AlGaAs layers is 200 nm, which indicates that Si ions have been activated in the AlGaAs layers insufficiently. From the fact that the substrate obtained by using the conventional recess etching process has sheet resistance Rs of about 300 Ω/□, it will be understood that the sheet resistance Rs on the same order as achieved by the conventional process can be achieved, provided that the total film thickness of the AlGaAs layers is 500 nm or less. The lower limit to the total thickness of the AlGaAs layers is not specified at a particular value as long as the electrical characteristics of the HFET according to the present invention meet predetermined standards. However, the number of carriers is reduced as the total film thickness of the AlGaAs layers is reduced, since the film thicknesses of the carrier supplying layers 12a and 12g are primarily reduced therein.

In this embodiment, the hot-plate annealing process is conducted at a temperature of 750° C.

Figure 8A:
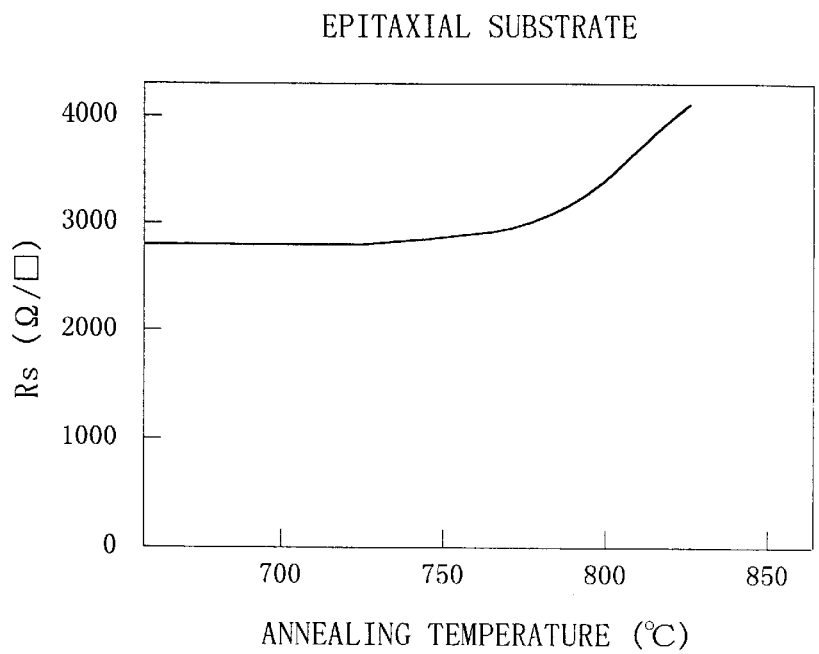
FIG. 8(a) is a graph showing sheet resistance plotted against an annealing temperature for a substrate having the heterojunction epitaxial layer in the semiconductor device in the first embodiment.
Figure 8B:
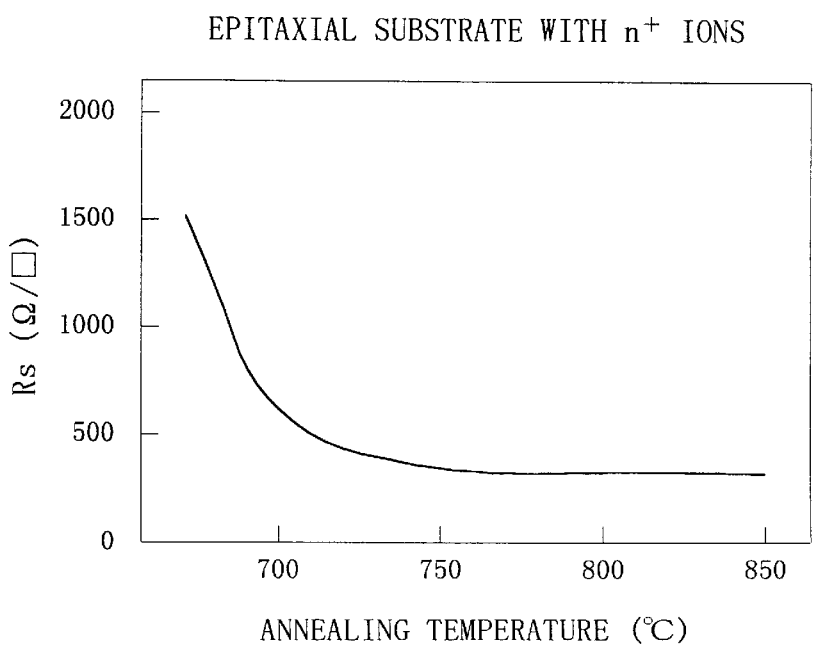
FIG. 8(b) is a graph showing sheet resistance plotted against an annealing temperature for a substrate having the heterojunction epitaxial layer containing an N-type impurity implanted therein in the semiconductor device in the first embodiment.

FIGS. 8(a) and 8(b) are graphs showing the dependence of the sheet resistance Rs of the epitaxial substrate on the annealing temperature in the HFET of this embodiment. FIG. 8(a) shows the dependence of the sheet resistance Rs of the epitaxial substrate on the annealing temperature before ions are implanted into the substrate. FIG. 8(b) shows the dependence of the sheet resistance Rs of the epitaxial substrate on the annealing temperature after ions are implanted into the substrate. As shown in FIG. 8(a), an annealing temperature over 800° causes a larger increase in the sheet resistance Rs of the epitaxial substrate. On the other hand, an annealing temperature under 700° activates implanted ions insufficiently, as shown in FIG. 8(b). Consequently, the optimum annealing temperature is around 750° C. However, since optimum conditions change if the epitaxial semiconductor layer has a different structure or if the implanting conditions are different, the annealing method and the annealing conditions are not limited thereto. The epitaxial structure is not limited to the structure used in this embodiment, either. An epitaxial substrate having another heterostructure such as an InP substrate formed with InAlAs, InGaAs, or the like may also be used.

Thus, in this embodiment, variations in the threshold voltages Vth of the HFETs are reduced since the gate electrode 14 is formed without performing recess etching with respect to the heterojunction epitaxial layer 12 formed on the substrate 11.

Moreover, since the total film thickness of the AlGaAs layers composing the heterojunction epitaxial layer 12 is adjusted at 50 nm or less, the sheet resistance Rs of the high-concentration regions 16B formed by using an ion-implantation technique can be reduced with certainty.

In this embodiment, non-doped InGaAs is used in the well layer 12e in which carriers drift. Alternatively, non-doped GaAs may be used instead.

Embodiment 2

Hereinafter, the second embodiment of the present invention will be described with reference to the drawings.

Figure 9A:
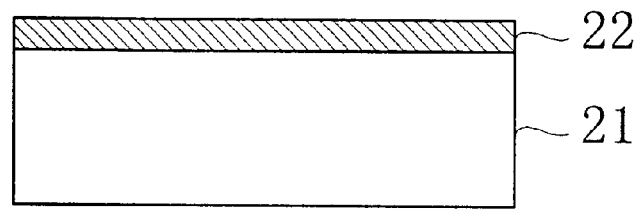
FIGS. 9(a) to 9(d) are cross-sectional views sequentially illustrating the process steps for manufacturing a semiconductor device in the second embodiment of the present invention.

FIGS. 9(a) to 9(d) and FIGS. 10(a) to 10(c) show cross-sectional structures sequentially illustrating the process steps for manufacturing a semiconductor device in the second embodiment. First, as shown in FIG. 9(a), a buffer layer composed of GaAs with a thickness of 500 nm, a first spacer layer composed of non-doped AlGaAs with a thickness of 200 nm, a first carrier supplying layer composed of N-type AlGaAs with a thickness of 5 nm, a second spacer layer composed of non-doped AlGaAs with a thickness of 2 nm, a well layer composed of non-doped InGaAs with a thickness of 15 nm, a third spacer layer composed of non-doped AlGaAs with a thickness of 2 nm, a second carrier supplying layer composed of N-type AlGaAs with a thickness of 7 nm, and a fourth spacer layer composed of non-doped GaAs with a thickness of 5 nm are formed sequentially on a substrate 21 composed of semi-insulating GaAs, for example, by an MOCVD method, thereby forming a heterojunction epitaxial layer 22.

Figure 9B:
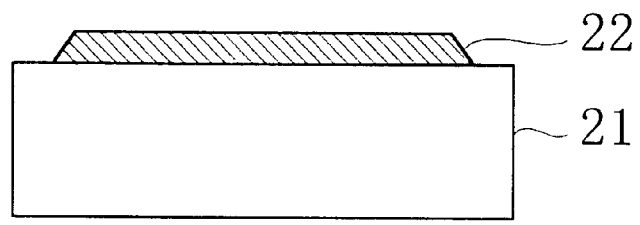
Figure 9C:
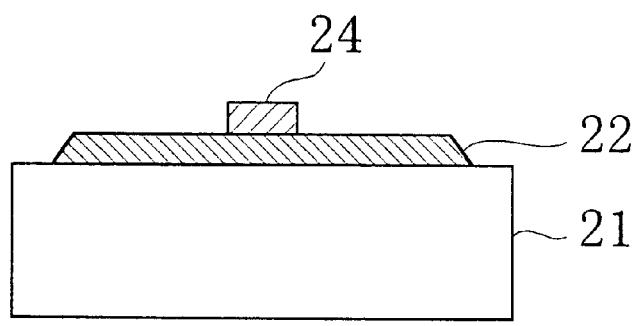

Next, as shown in FIG. 9(b), mesa etching is performed with respect to the heterojunction epitaxial layer 22 to implement element isolation. Then, as shown in FIG. 9(c), a gate electrode 24 composed of a refractory metal WSi, which can withstand an annealing process performed in the subsequent step, is formed in a specified region on the top surface of the heterojunction epitaxial layer 22.

Figure 9D:
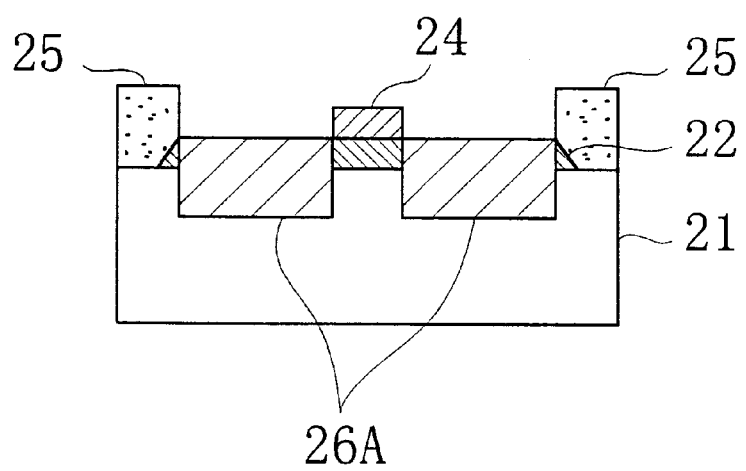

Next as shown in FIG. 9(d), a resist pattern 25 for masking the isolation region is formed by photolithography. Subsequently, Ar (argon) ions as inert ions are implanted at a dose of $1.0 \times 10^{13}$ cm$^{-2}$ with acceleration energy of 70 keV into the substrate 21 and into the heterojunction epitaxial layer 22 by using the resist pattern 25 and the gate electrode 24 as a mask. As a result, first ion-implanted regions 26A are formed.

Figure 10A:
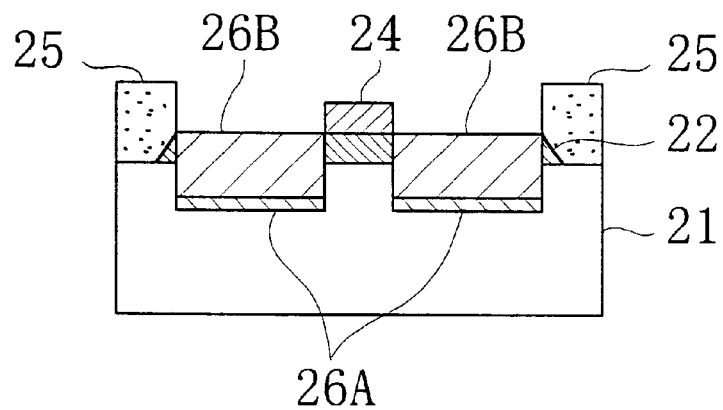
FIGS. 10(a) to 10(c) are cross-sectional views sequentially illustrating the process steps for manufacturing a semiconductor device in the second embodiment.

Next, as shown in FIG. 10(a), Si (silicon) ions as N-type impurity ions are implanted at a dose of $5.0 \times 10^{13}$ cm$^{-2}$ with acceleration energy of 50 keV into the substrate 21 and into the heterojunction epitaxial layer 22 by using the resist pattern 25 and the gate electrode 24 as a mask. As a result, second ion-implanted regions 26B are formed.

Figure 10B:
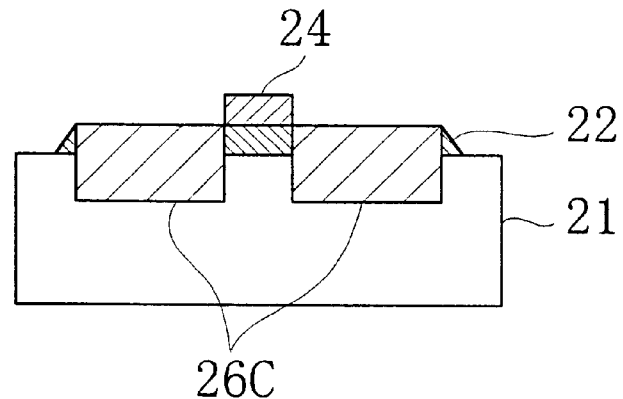

Next, as shown in FIG. 10(b), the resist pattern 25 is removed and a silicon oxide film (not shown) as a protective film against annealing is deposited over the entire surface of the substrate 21. Thereafter, hot-plate annealing is conducted at 750° C. for 30 seconds in an environment of nitrogen to activate the second ion-implanted regions 26B, thereby forming high-concentration N-type impurity diffusion regions 26C.

Figure 10C:
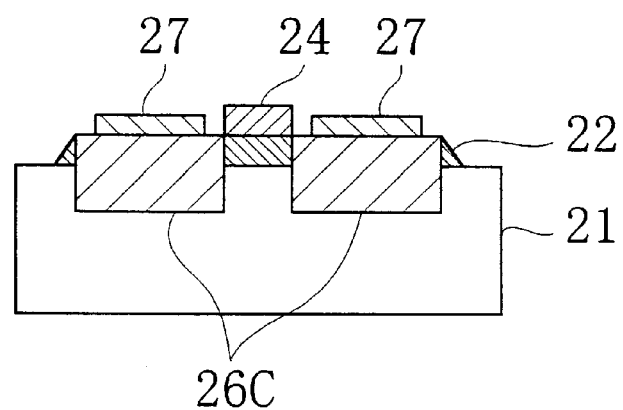

Next, as shown in FIG. 10(c), the protective film is removed and ohmic electrodes 27, to be source/drain electrodes, are formed selectively on the high-concentration impurity diffusion regions 26C of the heterojunction epitaxial layer 22, whereby the manufacturing of the HFET is completed.

The present embodiment is characterized in that the threshold voltage Vth can be determined by utilizing the structure of the heterojunction epitaxial layer 22 since recess etching is not performed with respect to the gate-electrode formation region of the heterojunction epitaxial layer 22, in the same way as in the first embodiment. In addition, the high-concentration N-type regions 26c are formed by self alignment with respect to the gate electrode 24. Thus, the epitaxial structure is not destroyed in the region of the heterojunction epitaxial layer 22 underlying the gate electrode 24, and the region of the heterojunction epitaxial layer 22 located between the source region and the gate electrode 24 is included in the high-concentration N-type region 26C. As a result, the source resistance (parasitic resistance) can be reduced and the performance of the HFET can be enhanced.

Figure 11:
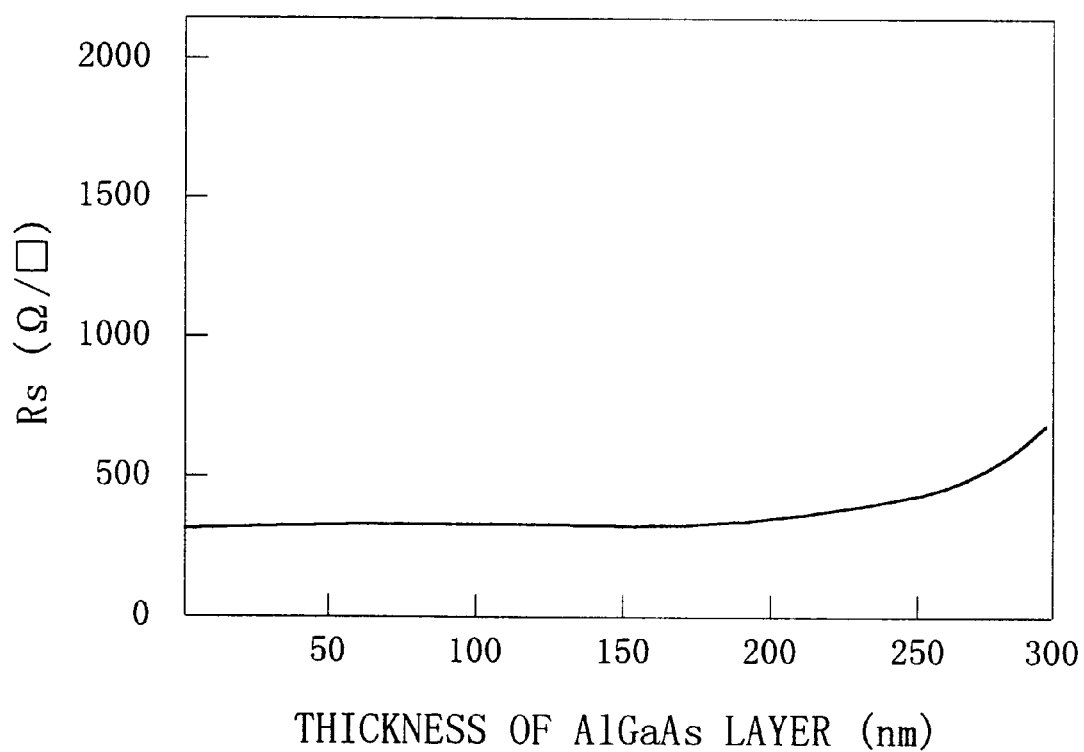
FIG. 11 is a graph showing sheet resistance plotted against the total film thickness of an AlGaAs layer composing a heterojunction epitaxial layer in the semiconductor device in the second embodiment.

FIG. 11 shows the relationship between the film thickness of the first spacer layer and the sheet resistance Rs thereof in the HFET of this embodiment manufactured by varying the thickness of the first spacer layer, which is composed of non-doped AlGaAs and overlies the buffer layer in the heterojunction epitaxial layer 22 under the implanting and annealing conditions described previously in this embodiment. As shown in FIG. 11, the sheet resistance of the first spacer layer is as low as 300 Ω/□ even when the film thickness thereof is 200 nm, which indicates that Si ions have been activated to a higher degree in the first spacer layer composed of non-doped AlGaAs.

Figure 12:
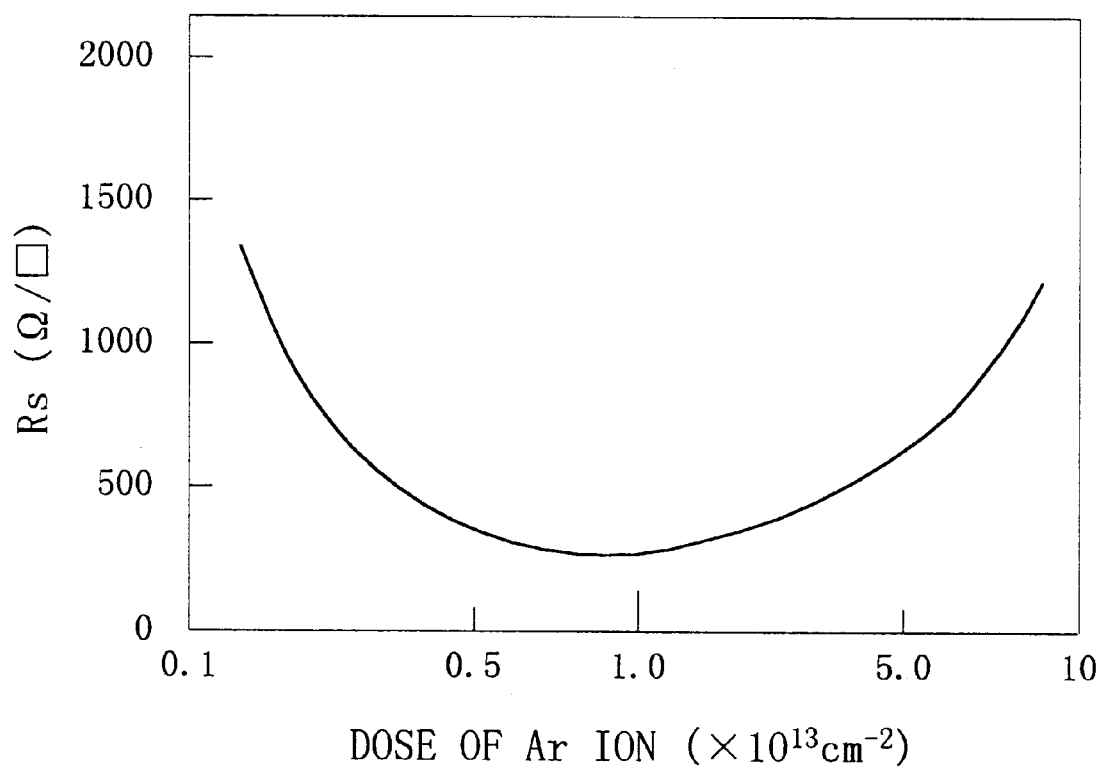
FIG. 12 is a graph showing sheet resistance plotted against the dose of Ar ion in the heterojunction epitaxial layer in the semiconductor device in the second embodiment.

FIG. 12 shows the relationship between the dose of Ar ions and the sheet resistance of the heterojunction epitaxial layer 22 in the HFET of this embodiment manufactured by varying the dose of Ar ions as inert ions, which have been implanted simultaneously with Si ions into the heterojunction epitaxial layer 22 under the Si-ion implanting conditions and annealing conditions described above. As shown in FIG. 12, the sheet resistance Rs reaches minimum when the dose of Ar ions is approximately $1.0 \times 10^{13}$ cm$^{-2}$.

Since the high-concentration N-type regions 26C have thus been formed by simultaneously implanting Ar ions and Si ions, the Si ions are activated to a higher degree because of the interaction of Ar ions and Si ions. Thus, the sheet resistance Rs of the high-concentration N-type regions 26C can be reduced with certainty.

In this embodiment, the sheet resistance Rs of the high-concentration N-type regions 26C can also be reduced with more certainty by adjusting the total film thickness of the AlGaAs layers composing the heterojunction epitaxial layer 22 at 50 nm or less.

In this embodiment, Si ions and Ar ions are used as the N-type impurity ions and the inert ions, respectively. However, the ion species are not limited thereto. Instead of Si ions and Ar ions, S (sulfur) ions and F (fluorine) ions may be used.

Embodiment 3

Hereinafter, the third embodiment of the present invention will be described with reference to the drawings.

Figure 13A:
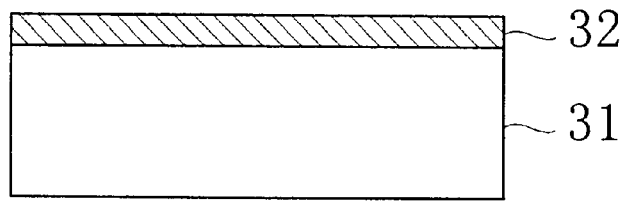
FIGS. 13(a) to 13(d) are cross-sectional views sequentially illustrating the process steps for manufacturing a semiconductor device in the third embodiment of the present invention.

FIGS. 13(a) to 13(d) and FIGS. 14(a) to 14(c) show cross-sectional structures sequentially illustrating the process steps for manufacturing a semiconductor device in the third embodiment. First, as shown in FIG. 13(a), a buffer layer composed of GaAs with a thickness of 500 nm, a first spacer layer composed of non-doped AlGaAs with a thickness of 200 nm, a first carrier supplying layer composed of N-type AlGaAs with a thickness of 5 nm, a second spacer layer composed of non-doped AlGaAs with a thickness of 2 nm, a well layer composed of non-doped InGaAs with a thickness of 15 nm, a third spacer layer composed of non-doped AlGaAs with a thickness of 2 nm, a second carrier supplying layer composed of N-type AlGaAs with a thickness of 7 nm, and a fourth spacer layer composed of non-doped GaAs with a thickness of 5 nm are grown sequentially on a substrate 31 composed of semi-insulating GaAs, for example, by an MOCVD method, thereby forming a heterojunction epitaxial layer 32.

Figure 13B:
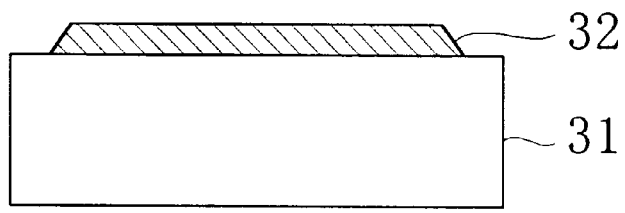
Figure 13C:
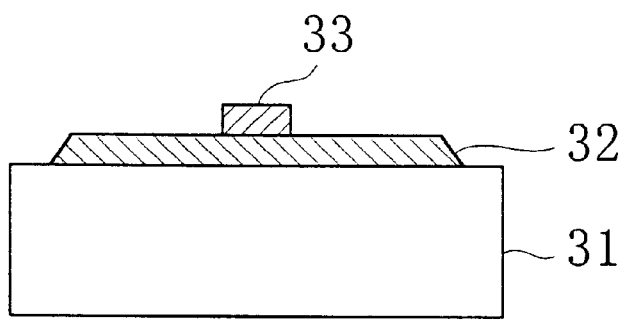

Next, as shown in FIG. 13(b), mesa etching is performed with respect to the heterojunction epitaxial layer 32 to implement element isolation. Then, as shown in FIG. 13(c), a gate electrode 33 composed of a refractory metal WSi, which can withstand an annealing process performed in the subsequent step, is formed in a specified region on the top surface of the heterojunction epitaxial layer 32.

Figure 13D:
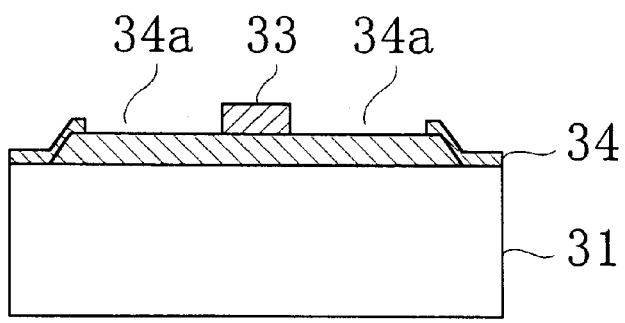

Next, as shown in FIG. 13(d), a silicon oxide film 34, for example, is deposited as an insulating film over the entire surface of the substrate 31. Openings 34a for plasma processing are provided through the respective portions of the silicon oxide film 34, in which diffusion regions are to be formed.

Figure 14A:
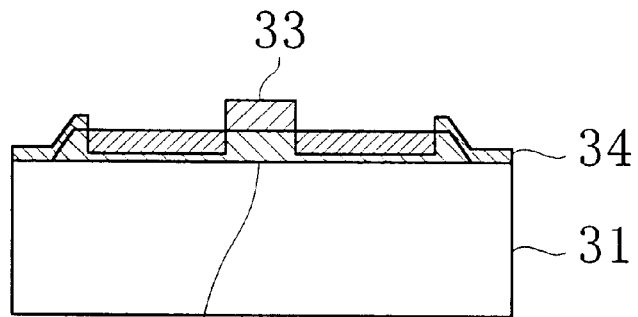
FIGS. 14(a) to 14(c) are cross-sectional views sequentially illustrating the process steps for manufacturing a semiconductor device in the third embodiment.

Next, as shown in FIG. 14(a), the heterojunction epitaxial layer 32 is subjected to plasma processing, which is performed for 120 seconds in a mixed gas of $SF_6$ and $CF_4$ under a pressure of 200×133.322 mPa (133.322 mPa=1 Torr) and with an output power of 100 W, by using the silicon oxide film 34 and the gate electrode 33 as a mask.

Figure 14B:
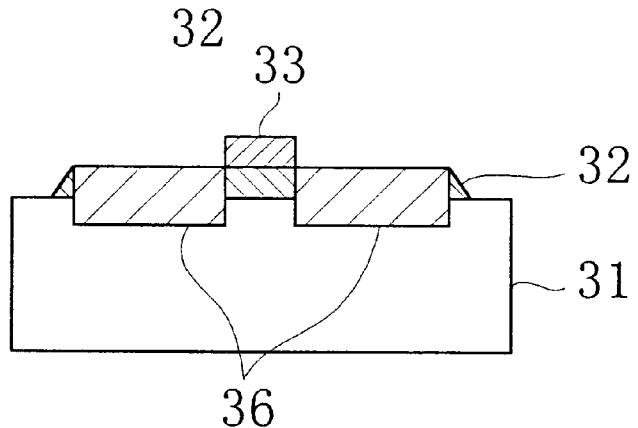

Next, as shown in FIG. 14(b), the silicon oxide film 34 is removed and a silicon oxide film (not shown) as a protective film against annealing is deposited over the entire surface of the substrate 31. Thereafter, hot-plate annealing is performed for 30 seconds at a temperature of 750° C. in an environment of hydrogen, thereby forming the high-concentration N-type impurity diffusion regions 36.

Figure 14C:
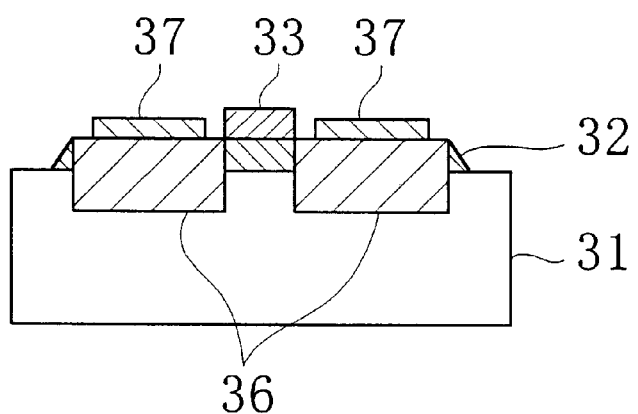

Next, as shown in FIG. 14(c), the protective film is removed and ohmic electrodes 37, to be source/drain electrodes, are formed selectively on the high-concentration N-type regions 36 of the heterojunction epitaxial layer 32, whereby the manufacturing of the HFET is completed.

The present embodiment is characterized in that the threshold voltage Vth can be determined by utilizing the structure of the heterojunction epitaxial layer 32 since recess etching is not performed with respect to the gate-electrode formation region of the heterojunction epitaxial layer 32, in the same way as in the first or the second embodiment. In addition, since the high-concentration N-type regions 36 are formed by self alignment with respect to the gate electrode 33, the epitaxial structure is not destroyed in the region of the heterojunction epitaxial layer 32 underlying the gate electrode 33. Also, the region of the heterojunction epitaxial layer 32 located between the source region and the gate electrode 33 is included in the high-concentration N-type region 36. As a result, the source resistance (parasitic resistance) can be reduced and the performance of the HFET can be enhanced.

Figure 15:
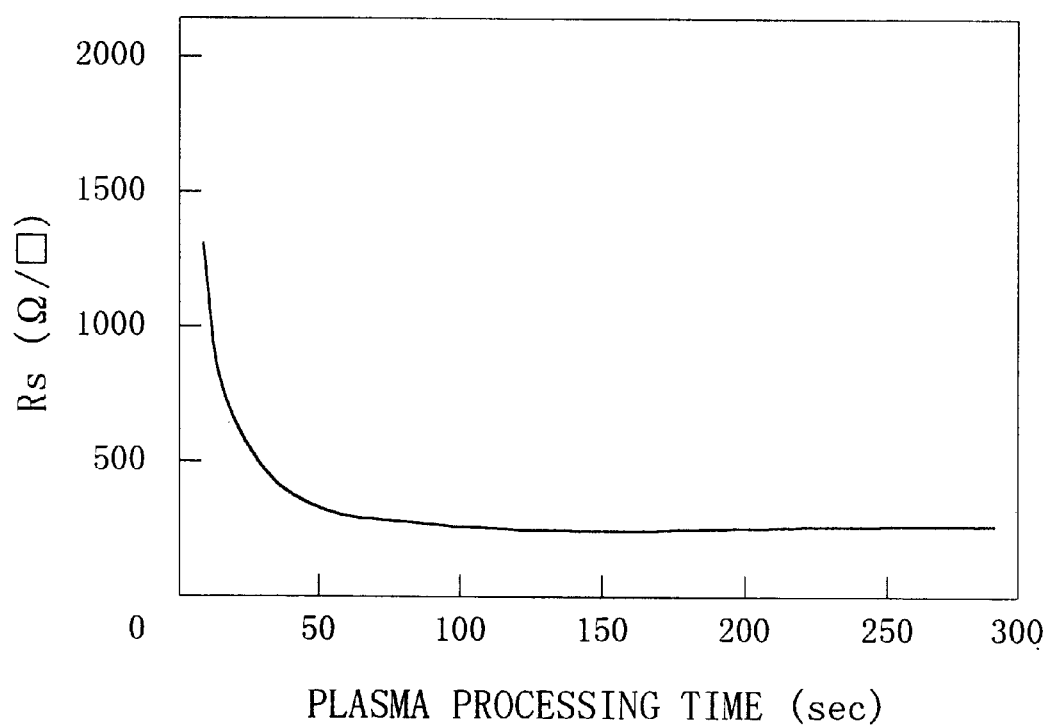
FIG. 15 is a graph showing sheet resistance plotted against a plasma processing time for a heterojunction epitaxial layer in the semiconductor device in the third embodiment.

FIG. 15 shows the relationship between the plasma processing time and sheet resistance Rs in the HFET of this embodiment manufactured by varying the plasma processing time for the heterojunction epitaxial layer 32 and using the foregoing annealing conditions. As shown in FIG. 15, the sheet resistance Rs decreases as the plasma processing time increases. The value of sheet resistance Rs is reduced to about 300 Ω/□ at a point in time the plasma processing time reaches 120 seconds. This is because, S (sulfur), which has entered the substrate 31 or has been attached to the surface of the heterojunction epitaxial layer 32 as a result of plasma processing, is activated by annealing. In this embodiment, annealing is performed for 30 seconds at a temperature of 750° C. However, since the value of sheet resistance Rs changes in a different environment or in a different method, the plasma processing time naturally varies depending upon the conditions.

In this embodiment, the sheet resistance Rs of the high-concentration N-type region 36 can also be reduced with more certainty by adjusting the total thickness of the AlGaAs layers composing the heterojunction epitaxial layer 32 at 50 nm or less.

In this embodiment, a mixed gas of $SF_6$ and $CF_4$ is used for plasma processing. Alternatively, another gas containing S (sulfur) may be used instead.

Since the high-concentration N-type regions 36 are formed by performing plasma processing using the gas mixture of $SF_6$ and $CF_4$ in this manner, the sheet resistance Rs of the source/drain diffusion regions can be reduced with certainty.

Embodiment 4

Hereinafter, the fourth embodiment of the present invention will be described with reference to the drawings.

Figure 16:
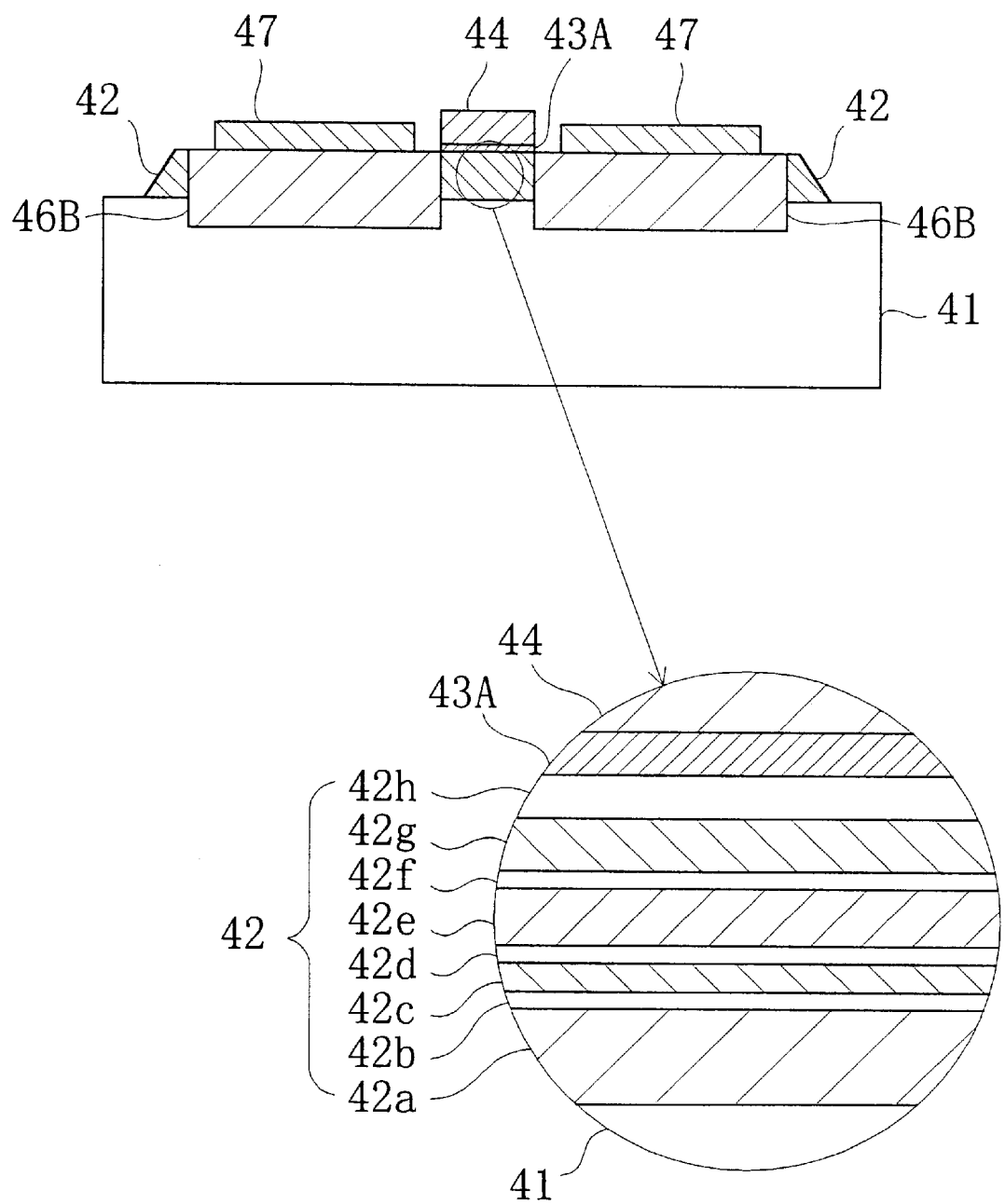
FIG. 16 shows a cross-sectional structure of a semiconductor device in the fourth embodiment of the present invention.

FIG. 16 shows a cross-sectional structure of a semiconductor device in the fourth embodiment of the present invention. As shown in FIG. 16, a heterojunction epitaxial layer 42 including a first semiconductor layer containing Al and having a thickness of 50 nm and a second semiconductor layer different in composition from the first semiconductor layer is formed on a substrate 41 composed of semi-insulating GaAs. A gate electrode 44 is formed on a P-type epitaxial layer 43A overlying a specified region on the top surface of the heterojunction epitaxial layer 42. High-concentration N-type impurity diffusion regions 46B are formed in the source/drain formation regions, respectively. Ohmic electrodes 47 are formed on the respective high-concentration N-type regions 46B. These components constitute an HFET.

The heterojunction epitaxial layer 42 shown in FIG. 16 includes, for example: a buffer layer 42a composed of GaAs with a thickness of 200 nm; a first spacer layer 42b composed of non-doped AlGaAs with a thickness of 2 nm; a first carrier supplying layer 42c composed of N-type AlGaAs with a thickness of 5 nm; a second spacer layer 42d composed of non-doped AlGaAs with a thickness of 2 nm; a well layer 42e composed of non-doped InGaAs with a thickness of 15 nm; a third spacer layer 42f composed of non-doped AlGaAs with a thickness of 2 nm; a second carrier supplying layer 42g composed of N-type AlGaAs with a thickness of 12 nm; and a fourth spacer layer 42h composed of non-doped GaAs with a thickness of 5 nm. All these layers are formed sequentially on the substrate 41 as shown in the enlarged view illustrating a region under the gate electrode 44 on a larger scale. A P-type epitaxial layer 43A, composed of GaAs and doped with Zn (zinc) as a P-type dopant, is further formed on the fourth spacer layer 42 and under the gate electrode 44. Although the P-type epitaxial layer 43A is not always required to be formed only under the gate electrode 44, the P-type epitaxial layer 43A should not be extended so far as to reach the region under any of the ohmic electrodes 47. This is because, in such a case, the resistance in the extension is adversely increased and the electrical characteristics are likely to be deteriorated.

The first semiconductor layer containing aluminum and having a thickness of 50 nm or less is constituted by the first spacer layer 42b, the first carrier supplying layer 42c, the second spacer layer 42d, the third spacer layer 42f, and the second carrier supplying layer 42g. The second semiconductor layer is constituted at least by the well layer 42e among the buffer layer 42a, the well layer 42e, and the fourth spacer layer 42h.

In the HFET, the first carrier supplying layer 42c, composed of N-type AlGaAs, is formed under the second spacer layer 42d, which is composed of non-doped AlGaAs and underlies the well layer 42e composed of non-doped InGaAs. The second carrier supplying layer 42g, composed of N-type AlGaAs, is formed over the third spacer layer 42f, which is composed of non-doped AlGaAs and overlies the well layer 42e. As a result, a double heterojunction is formed. Since the well layer 42e has a lower energy level than that of the first and the second carrier supplying layers 42c and 42g, carriers (electrons) flowing from the first and the second carrier supplying layers 42c and 42g to the well layer 42e can be confined in the well layer 42e. Therefore, the acceleration of the carriers with the application of a drain bias voltage enables the carriers to drift at a high speed. The second and the third spacer layers 42d and 42f have been provided to prevent the carriers drifting in the well layer 42e from being affected by the impurity ions contained in the first and the second carrier supplying layers 42c and 42g.

As described above, since the threshold voltage Vth of the HFET is determined by the heterojunction epitaxial layer 42, the controllability of the threshold voltage Vth and the uniformity thereof across the surface of a wafer are determined by the epitaxial substrate itself. Since conventional recess etching is not performed with respect to the gate-electrode of the HFET of this embodiment, variations in threshold voltage Vth can be restricted to the variations specific to the epitaxial substrate.

According to the operational principle of the HFET, the source-to-drain current is controlled with the application of a voltage to the gate electrode 44. On the other hand, the voltage applicable to the gate electrode 44 is determined by the characteristic of the Schottky contact between the gate metal and the semiconductor, which contact is located between the source/drain electrodes. A negative limit value of the voltage applicable to the gate electrode is controlled by the value of the maximum withstand reverse bias, which is determined by the concentration of carriers in the semiconductor and the distance between the gate and drain electrodes. Thus, the device utilizing the negative voltage can be designed more easily. On the other hand, a positive limit value of the voltage applicable to the gate electrode is controlled by the height $\phi$ b of a Schottky barrier and seldom varies in accordance with the type of the metal used to make the Schottky contact. For example, the height $\phi$ b is on the order of 0.8 eV when the Schottky contact is made between the metal and an N-type semiconductor or non-doped GaAs.

In a normally-OFF HFET that is in the pinch-off state with no source-to-drain current flowing when the gate voltage is 0 V, a positive gate voltage is applied to operate the HFET. Thus, it is necessary to increase gate voltage in order to enhance the current drive capability of the HFET. For this purpose, it is necessary to increase the barrier height $\phi$ b. Since the HFET in this embodiment has the P-type epitaxial layer 43A between the gate electrode 44 and the heterojunction epitaxial layer 42 making Schottky contact with the gate electrode 44, a P-N junction is formed between the P-type epitaxial layer 43A and the N-type heterojunction epitaxial layer 42. As a result, the barrier height $\phi$ b can be increased.

Figure 17:
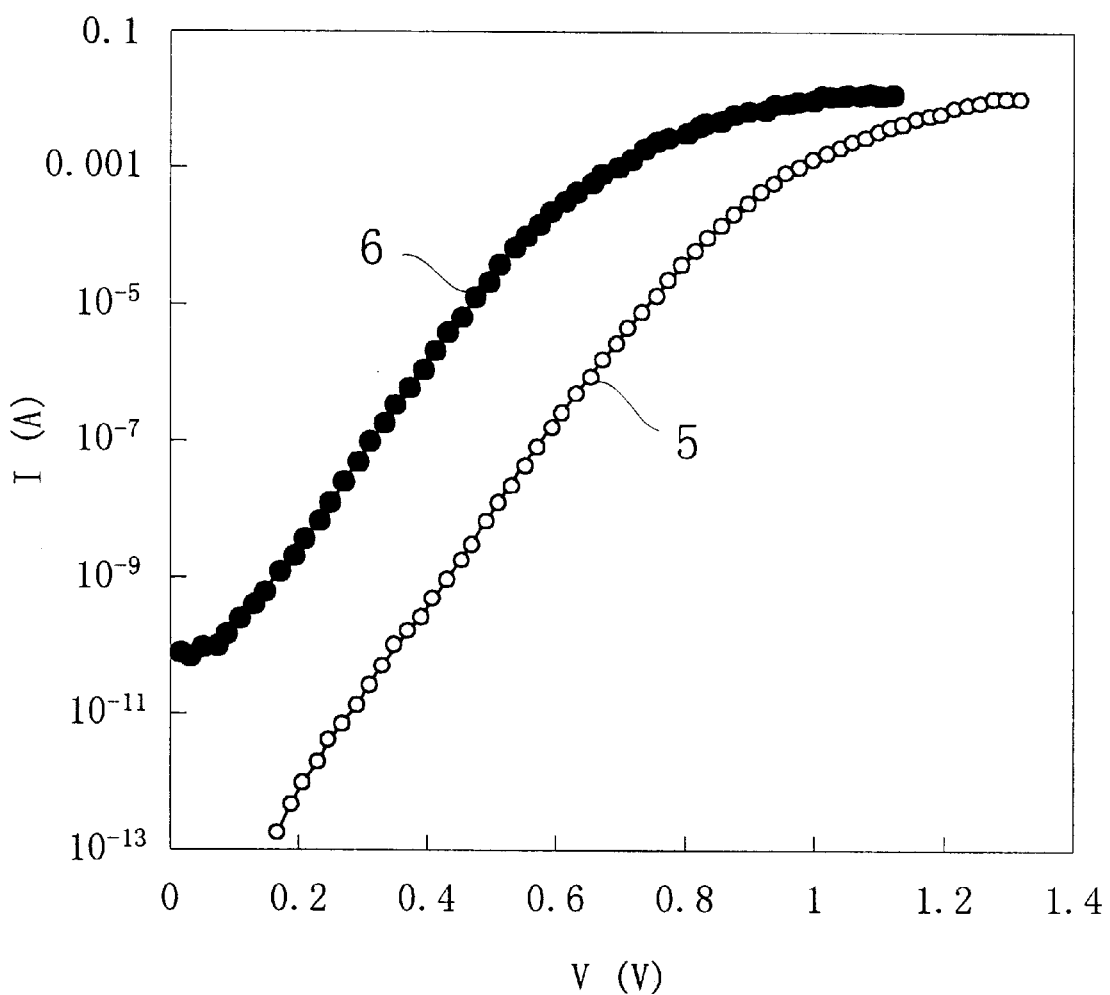
FIG. 17 is a graph showing Schottky I-V characteristics of the semiconductor device in the fourth embodiment.

FIG. 17 shows, in comparison, the Schottky I-V characteristic of the HFET in this embodiment shown in FIG. 16 and the Schottky I-V characteristic of the HFET (identified by the reference numeral 6) not including the P-type epitaxial layer 43A. The barrier height $\phi$ b was calculated for each of the HFETs by using the Schottky I-V characteristic. As a result, the barrier height $\phi$ b for the HFET not including the P-type epitaxial layer 43A was 0.8 eV and the barrier height $\phi$ b for the HFET including the P-type epitaxial layer 43A was 1.03 eV.

Hereinafter, a method of manufacturing the semiconductor device in the fourth embodiment will be described with reference to the drawings.

Figure 18A:
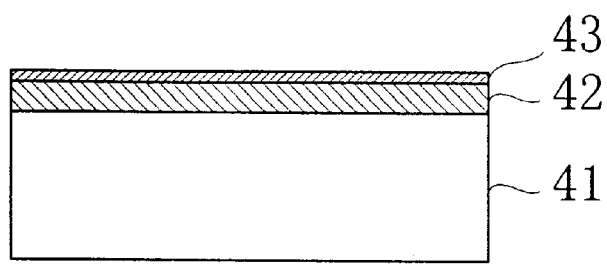
FIGS. 18(a) to 18(d) are cross-sectional views sequentially illustrating the process steps for manufacturing a semiconductor device in the fourth embodiment.

FIGS. 18(a) to 18(d) and FIGS. 19(a) to 19(c) show cross-sectional structures sequentially illustrating the process steps for manufacturing a semiconductor device in the fourth embodiment. First, as shown in FIG. 18(a), the buffer layer composed of GaAs with a thickness of 200 nm, the first spacer layer composed of non-doped AlGaAs with a thickness of 2 nm, the first carrier supplying layer composed of N-type AlGaAs with a thickness of 5 nm, the second spacer layer composed of non-doped AlGaAs with a thickness of 2 nm, the well layer composed of non-doped InGaAs with a thickness of 15 nm, the third spacer layer composed of non-doped AlGaAs with a thickness of 2 nm, the second carrier supplying layer composed of N-type AlGaAs with a thickness of 12 nm, and the fourth spacer layer composed of non-doped GaAs with a thickness of 5 nm are grown sequentially on the substrate 41 composed of semi-insulating GaAs, for example, by an MOCVD method, thereby forming the heterojunction epitaxial layer 42. Subsequently, the P-type epitaxial layer 43 composed of P-type GaAs with a thickness of 15 nm is formed over the entire top surface of the fourth spacer layer.

Figure 18B:
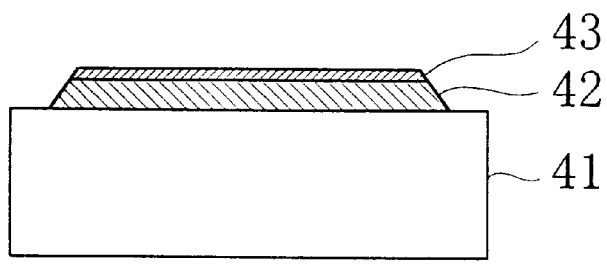
Figure 18C:
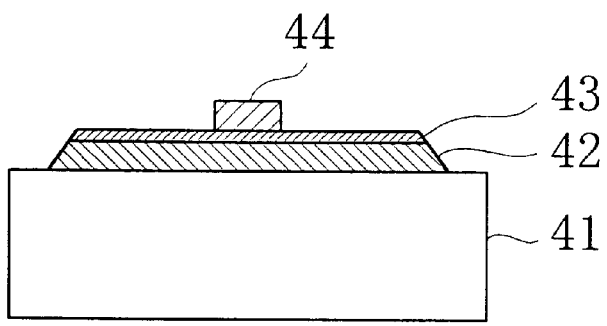
Figure 18D:
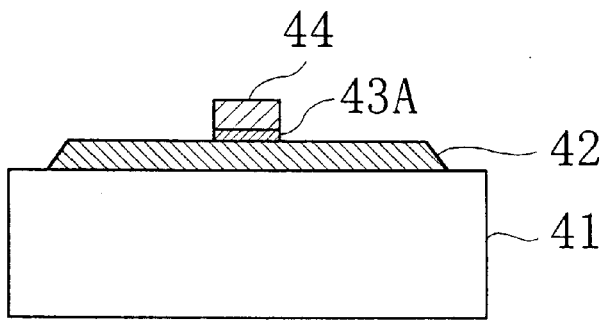

Next, as shown in FIG. 18(b), mesa etching is performed with respect to the P-type epitaxial layer 43 and to the heterojunction epitaxial layer 42 to implement element isolation. Then, as shown in FIG. 18(c), a gate electrode 44 composed of a refractory metal WSi, which can withstand an annealing process performed in the subsequent step, is formed on a specified region of the top surface of the heterojunction epitaxial layer 42. Subsequently, as shown in FIG. 18(d), etching is performed with respect to the P-type epitaxial layer 43 masked with the gate electrode 44, thereby forming the P-type epitaxial layer 43A under the gate electrode 44.

Figure 19A:
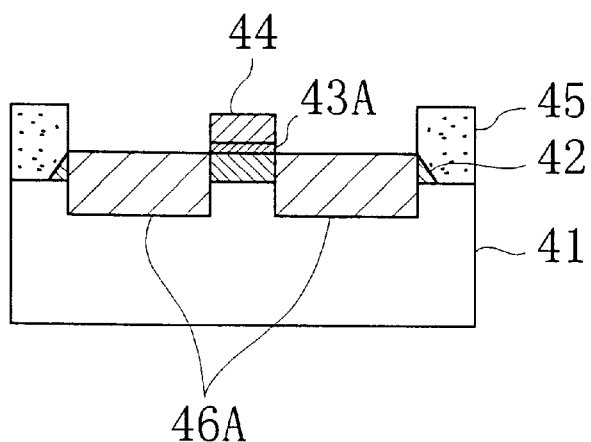
FIGS. 19(a) to 19(c) are cross-sectional views sequentially illustrating the process steps for manufacturing a semiconductor device in the fourth embodiment.

Next, as shown in FIG. 19(a), the resist pattern 45 for masking isolation regions is formed by photolithography. Then, N-type impurity ions, such as Si ions, are implanted at a dose of $5.0 \times 10^{13}$ cm$^{-2}$ and with acceleration energy of 50 keV into the substrate 41 and into the heterojunction epitaxial layer 42 by using the resist pattern 45 and the gate electrode 44 as a mask. As a result, ion-implanted regions 46A are formed.

Figure 19B:
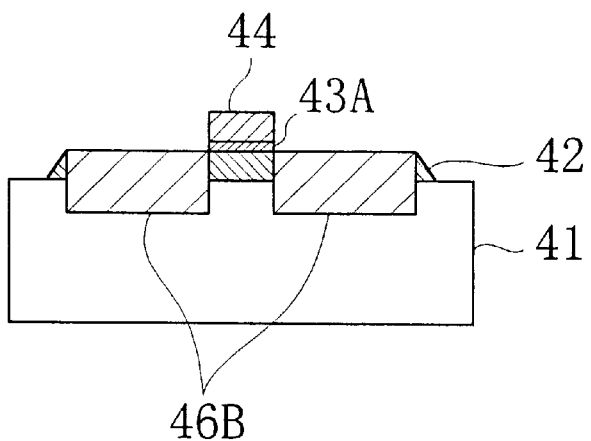

Next, as shown in FIG. 19(b), the resist pattern 45 is removed and a silicon oxide film (not shown) as a protective film against annealing is deposited over the entire surface of the substrate 41. Thereafter, hot-plate annealing is conducted at a temperature of 750° C. for 30 seconds in an environment of nitrogen to activate the ion-implanted regions 46A, thereby forming high-concentration N-type regions 46B.

Figure 19C:
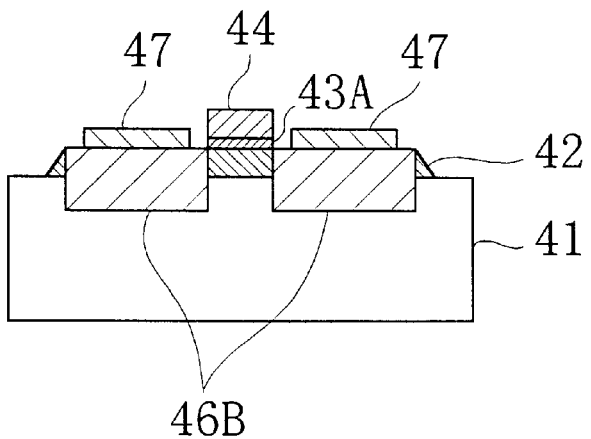

Next, as shown in FIG. 19(c), the protective film is removed and the ohmic electrodes 47, to be source/drain electrodes, are formed selectively on the high-concentration N-type regions 46B of the heterojunction epitaxial layer 42, whereby the manufacturing of the HFET is completed.

Figure 20:
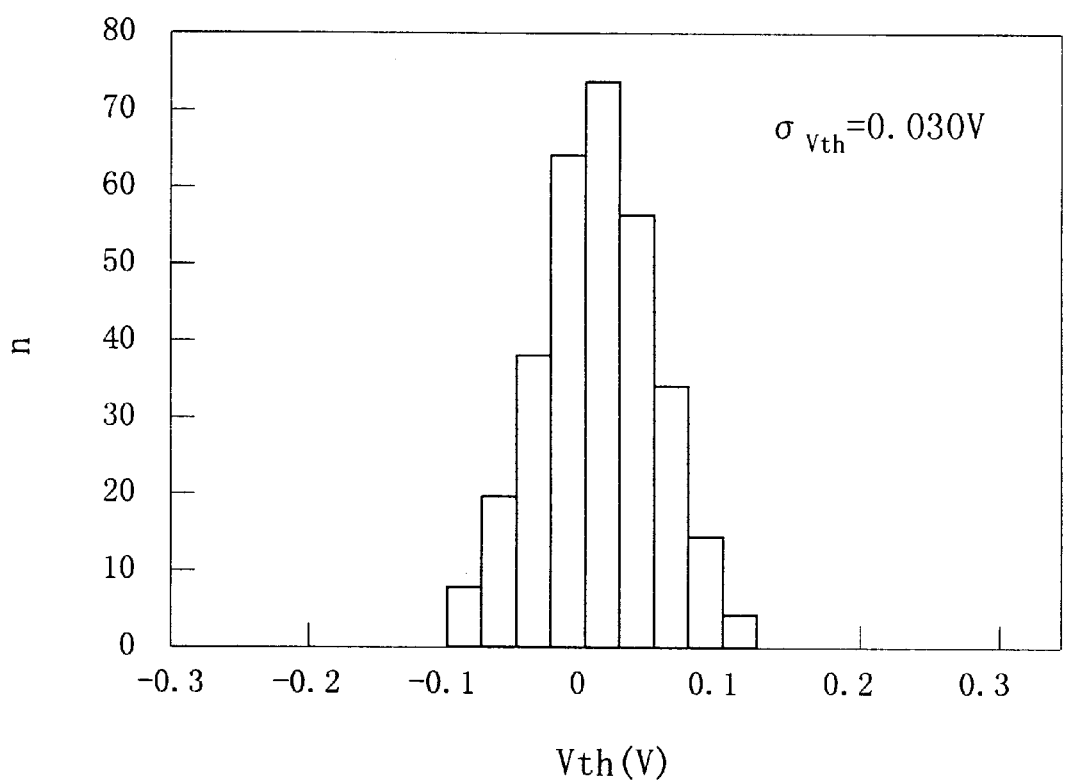
FIG. 20 shows the distribution of the threshold voltages of HFETs manufactured by a method of manufacturing a semiconductor device of the fourth embodiment.

FIG. 20 shows the distribution of the threshold voltages Vth of the HFETs of this embodiment, which were measured on the surfaces of 3-inch wafers. In the graph, the axis of abscissas represents a threshold voltage and the axis of ordinates represents the number n of samples. As shown in FIG. 20, the standard deviation σ of the threshold voltages Vth is 0.030 V, which indicates significantly reduced variations.

The present embodiment is characterized by the high-concentration N-type regions 46B formed by self alignment with respect to the gate electrode 44. Thus, the epitaxial structure is not destroyed in the region of the heterojunction epitaxial layer 42 underlying the gate electrode 44. Also, the region of the heterojunction epitaxial layer 42 located between the source region and the gate electrode 44 is included in the high-concentration N-type region 46B. As a result, the source resistance (parasitic resistance) can be reduced and the performance of the HFET can be enhanced.

Figure 21:
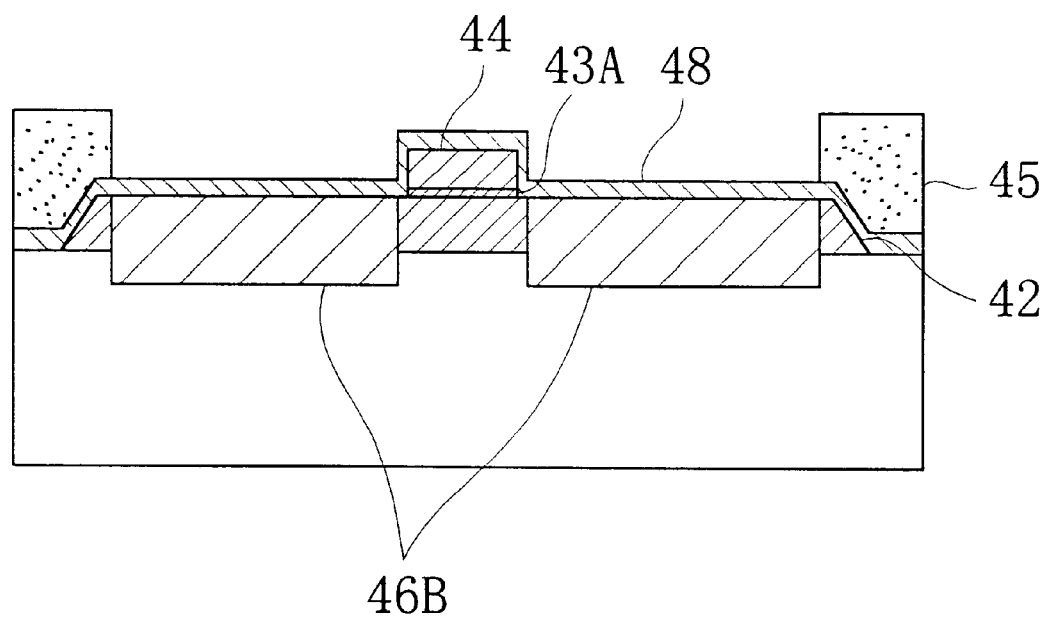
FIG. 21 is a cross-sectional view illustrating a process steps for manufacturing a semiconductor device in the fourth embodiment.

As shown in FIG. 21, if ions are implanted into the heterojunction epitaxial layer 42 through an insulating film 48 deposited after the step shown in FIG. 18(d) has been performed, the gap between each side of the gate electrode 44 and the ion-implanted region 46A adjacent thereto can be increased. As a result, a Schottky breakdown voltage is increased.

Figure 22A:
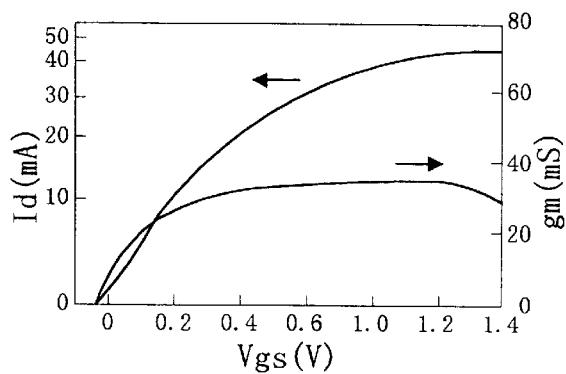
FIG. 22(a) is a graph showing drain current and transconductance each plotted against a gate-to-source voltage in the semiconductor device in the fourth embodiment.
Figure 22B:
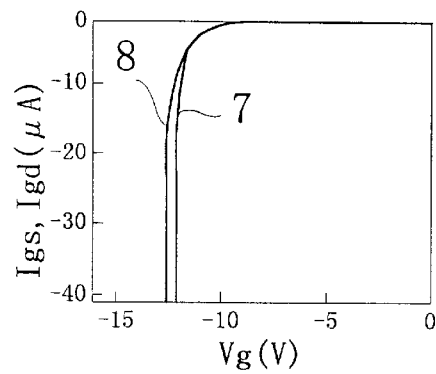
FIG. 22(b) is a graph showing gate-to-source current and gate-to-drain current each plotted against a gate voltage in the semiconductor device in the fourth embodiment.
Figure 22C:
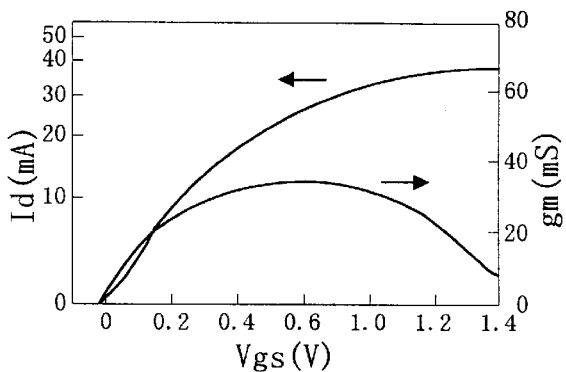
FIG. 22(d) is a graph showing gate-to-source current and gate-to-drain current each plotted against a gate voltage in the semiconductor device in which no P-type epitaxial layer is formed under the gate electrode.
Figure 22D:
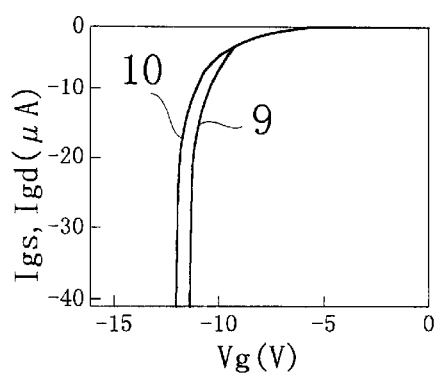

FIGS. 22(a) to 22(d) show the electrical characteristics of the HFET. FIG. 22(a) shows drain current Id and transconductance gm each plotted against a gate-to-source voltage Vgs in the HFET of this embodiment. FIG. 22(b) shows gate-to-source current Igs (identified by the reference numeral 7) and gate-to-drain current Igd (identified by the reference numeral 8) each plotted against a gate voltage Vg in the HFET of this embodiment. FIG. 22(c) shows drain current Id and transconductance gm each plotted against a gate-to-source voltage Vgs in an HFET not including the P-type epitaxial layer 43A for comparison. FIG. 22(d) shows gate-to-source current Igs (identified by the reference numeral 9) and gate-to-drain current Igd (identified by the reference numeral 10) each plotted against the HFET not including the P-type epitaxial layer 43A. As can be seen if FIGS. 22(a) and 22(c) are compared, the transconductance gm is seldom reduced in the HFET according to the present invention, even when the gate-to-source voltage Vgs is increased. This is because the barrier height φ b is increased by the P-type epitaxial layer 3A provided between the gate electrode 44 and the heterojunction epitaxial layer 42. As can be seen if FIGS. 22(b) and 22(d) are compared, Schottky reverse characteristic (maximum withstand reverse bias) shows a more abrupt curve and the maximum withstand voltage has a larger absolute value because the P-N junction is formed under the gate electrode 44.

As described above, the degree of activation of the ions implanted into the epitaxial layer by using an ion-implantation technique is largely dependent on the film thickness of the AlGaAs layer, and the sheet resistance Rs increases abruptly when the film thickness exceeds 50 nm. In this embodiment, the total film thickness of the AlGaAs layers composing the heterojunction epitaxial layer 42 has been adjusted at 23 nm and the sheet resistance is 280 Ω/□.

In this embodiment, since the P-type epitaxial layer 43A is provided between the heterojunction epitaxial layer 42 and the gate electrode 44, the height φb of a Schottky barrier can be increased. Thus, a higher positive gate voltage can be applied. As a result, the current drive capability can be increased by the application of a positive gate voltage and an operation using a single power source is realized.

Moreover, since the gate electrode 44 is formed without performing recess etching with respect to the heterojunction epitaxial layer 42, variations in the threshold, voltages Vth of the HFETs can be minimized.

Furthermore, since the high-concentration N-type regions 46B are formed by adjusting the total film thickness of the AlGaAs layers composing the heterojunction epitaxial layer 42 at 50 nm or less and implanting ions into the heterojunction epitaxial layer 42, the sheet resistance Rs can be reduced.

In this embodiment, the hot-plate annealing process is performed for 30 seconds at a temperature of 750° C. Alternatively, the hot-plate annealing process may be performed under such conditions as to increase the degree to which the high-concentration N-type regions 46B are activated, as long as the epitaxial structure in the region of the heterojunction epitaxial layer 42 under the gate electrode 44 is not destroyed.

Embodiment 5

In the first to the fourth embodiments, an AlGaAs/InGaAs/AlGaAs HFETs using a GaAs substrate has been described. In this fifth embodiment, an InAlAs/InGaAs/InAlAs HFET using an InP substrate will be described.

Hereinafter, the fifth embodiment of the present invention will be described with reference to the drawings.

Figure 23:
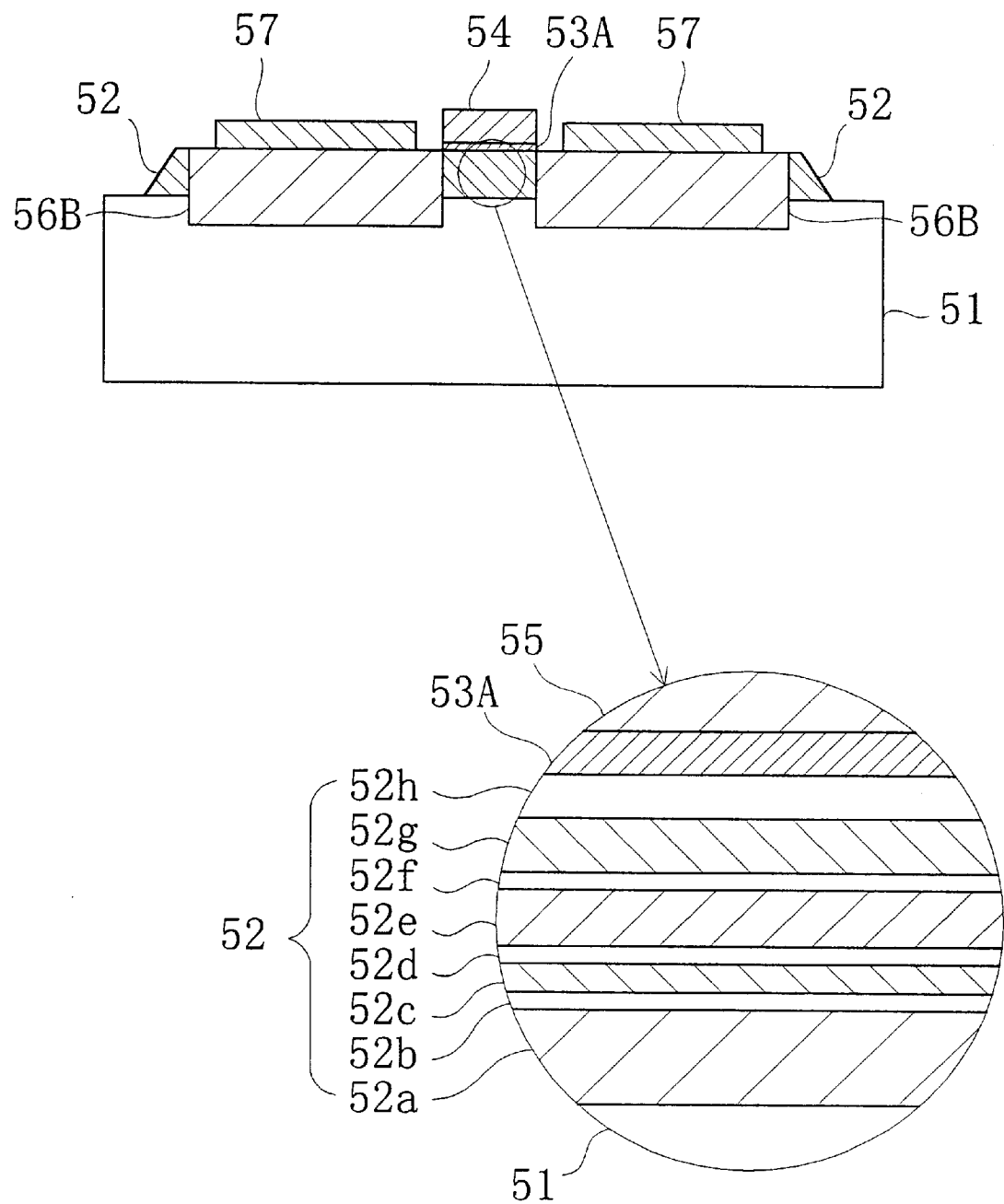
FIG. 23 shows a cross-sectional structure of a semiconductor device in the fifth embodiment of the present invention.

FIG. 23 shows a cross-sectional structure of a semiconductor device in the fifth embodiment. In FIG. 23, a heterojunction epitaxial layer 52 including a first semiconductor layer containing Al and having a thickness of 50 nm or less and a second semiconductor layer different in composition from the first semiconductor layer is formed on a substrate 51 composed of semi-insulating InP. A gate electrode 54 is formed on a P-type epitaxial layer 53A overlying a specified region on the top surface of the heterojunction epitaxial layer 52. High-concentration N-type impurity diffusion regions 56B are formed in the source/drain formation regions, respectively. Ohmic electrodes 57 are formed on the high-concentration N-type regions 56B. These components constitute an HFET.

The heterojunction epitaxial layer 52 shown in FIG. 23 includes, for example: a buffer layer 52a composed of InP with a thickness of 200 nm; a first spacer layer 52b composed of non-doped InAlAs with a thickness of 2 nm; a first carrier supplying layer 52c composed of N-type InAlAs with a thickness of 5 nm; a second spacer layer 52d composed of non-doped InAlAs with a thickness of 2 nm; a well layer 52e composed of non-doped InGaAs with a thickness of 15 nm; a third spacer layer 52f composed of non-doped InAlAs with a thickness of 2 nm; a second carrier supplying layer 52g composed of N-type InAlAs with a thickness of 10 nm; and a fourth spacer layer 52h composed of non-doped InAlAs with a thickness of 5 nm. All these layers are formed sequentially on the substrate 51 as shown in the enlarged view showing a region under the gate electrode 54 on a larger scale. The P-type epitaxial layer 53A composed of InAlAs and doped with Zn (zinc) as a P-type dopant is further formed on the fourth spacer layer 52h and under the gate electrode 54. Although the P-type epitaxial layer 53A is not always required to be formed only under the gate electrode 54, the P-type epitaxial layer 53A should not be extended so far as to reach the region under any of the ohmic electrodes 57. This is because, in such a case, the resistance in the extension is adversely increased and the electrical characteristics are likely to be deteriorated.

The first semiconductor layer containing aluminum and having a thickness of 50 nm or less is constituted by the first spacer layer 52b, the first carrier supplying layer 52c, the second spacer layer 52d, the third spacer layer 52f, and the second carrier supplying layer 52g. The second semiconductor layer is constituted at least by the well layer 52e among the buffer layer 52a, the well layer 52e, and the fourth spacer layer 52h.

In the HFET, the first carrier supplying layer 52c, composed of N-type InAlAs, is formed under the second spacer layer 52d, which is composed of non-doped InAlAs and underlies the well layer 52e composed of non-doped InGaAs. The second carrier supplying layer 52g, composed of N-type InAlAs, is formed over the third spacer layer 52f, which is composed of non-doped InAlAs and overlies the well layer 52e. As a result, a double heterojunction is formed. Since the well layer 52e has a lower energy level than that of the first and second carrier supplying layers 52c and 52g, carriers (electrons) flowing from the first and the second carrier supplying layers 52c and 52g to the well layer 52e can be confined in the well layer 52e. Therefore, the acceleration of the carriers with the application of a drain bias voltage enables the carriers to drift at a high speed. The second and the third spacer layers 52d and 52f have been provided to prevent the carriers drifting in the well layer 52e from being affected by the impurity ions contained in the first and second carrier supplying layers 52c and 52g.

If the P-type epitaxial layer 53A is not formed in the HFET shown in FIG. 23, a forward rising voltage Vf in the Schottky I-V characteristic is only about 0.5 V. In contrast, the rising voltage Vf is as high as 0.9 V or more in the HFET of this embodiment. Therefore, the transconductance gm is also high in a region, to which a high gate voltage is applied. Thus, an HFET having an excellent current drive capability is provided.

Hereinafter, a method of manufacturing the semiconductor device in the fifth embodiment will be described with reference to the drawings.

Figure 24A:
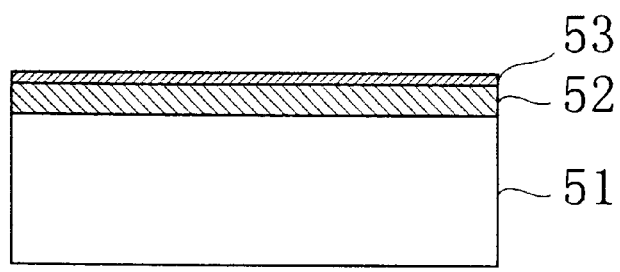
FIGS. 24(a) to 24(d) are cross-sectional views sequentially illustrating the process steps for manufacturing a semiconductor device in the fifth embodiment.

FIGS. 24(a) to 24(d) and FIGS. 25(a) to 25(c) show cross-sectional structures sequentially illustrating the process steps for manufacturing the semiconductor device in the fifth embodiment. First, as shown in FIG. 24(a), the buffer layer composed of InP with a thickness of 200 nm, the first spacer layer composed of non-doped InAlAs with a thickness of 2 nm, the first carrier supplying layer composed of N-type InAlAs with a thickness of 5 nm, the second spacer layer composed of non-doped InAlAs with a thickness of 2 nm, the well layer composed of non-doped InGaAs with a thickness of 15 nm, the third spacer layer composed of non-doped InAlAs with a thickness of 2 nm, the second carrier supplying layer composed of N-type InAlAs with a thickness of 10 nm, and the fourth spacer layer composed of non-doped InAlAs with a thickness of 5 nm are grown sequentially on the substrate 51 composed of semi-insulating InP, for example, by an MOCVD method, thereby forming the heterojunction epitaxial layer 52. Subsequently, the P-type epitaxial layer 53 composed of P-type InAlAs with a thickness of 15 nm is formed over the entire top surface of the fourth spacer layer.

Figure 24B:
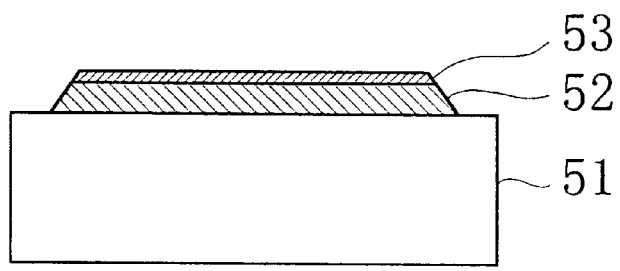
Figure 24C:
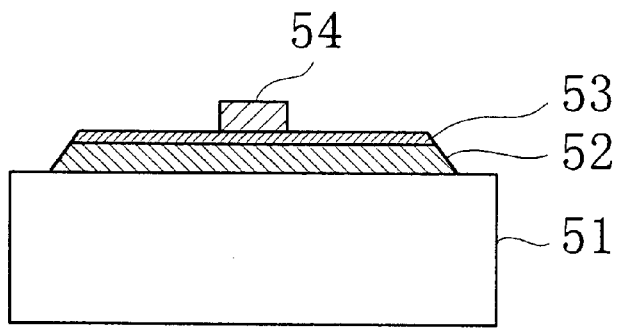
Figure 24D:
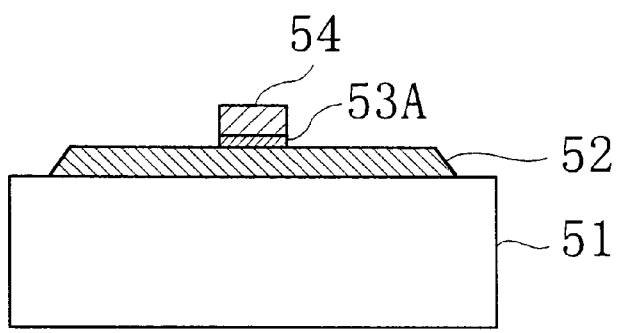

Next, as shown in FIG. 24(b), mesa etching is performed with respect to the P-type epitaxial layer 53 and to the heterojunction epitaxial layer 52 to implement element isolation. Then, as shown in FIG. 24(c), a gate electrode 54 composed of a refractory metal WSi, which can withstand an annealing process performed in the subsequent step, is formed on a specified region on the top surface of the heterojunction epitaxial layer 52. Subsequently, as shown in FIG. 24(d), etching is performed with respect to the P-type epitaxial layer 53 masked with the gate electrode 54, thereby forming the P-type epitaxial layer 53A under the gate electrode 54.

Figure 25A:
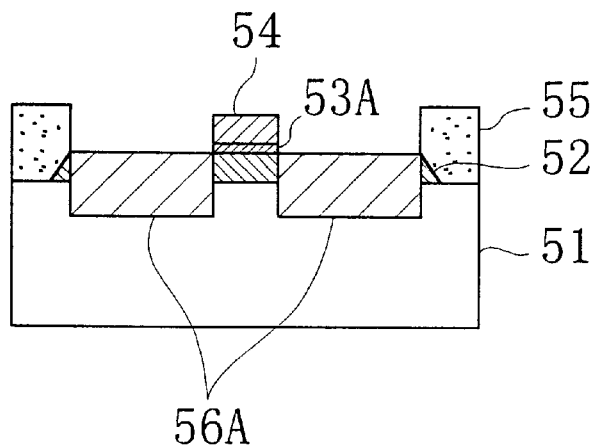
FIGS. 25(a) to 25(c) are cross-sectional views sequentially illustrating the process steps for manufacturing a semiconductor device in the fifth embodiment.

Next, as shown in FIG. 25(a), the resist pattern 55 for masking isolation regions is formed by photolithography. Then, N-type impurity ions, such as Si ions, are implanted at a dose of $5.0 \times 10^{13}$ cm$^{-2}$ and with acceleration energy of 50 keV into the substrate 51 and into the heterojunction epitaxial layer 52 by using the resist pattern 55 and the gate electrode 54 as a mask. As a result, ion-implanted regions 56A 20 are formed.

Figure 25B:
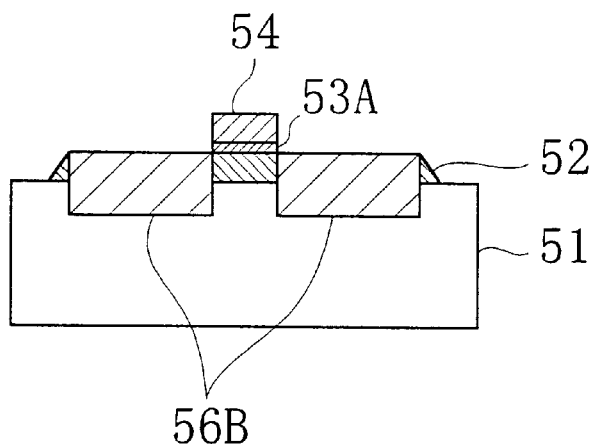

Next, as shown in FIG. 25(b), the resist pattern 55 is removed, and a silicon oxide film (not shown) as a protective film against annealing is deposited over the entire surface of the substrate 51. After that, hot-plate annealing is conducted at a temperature of 750° C. for 30 seconds in an environment of nitrogen to activate the ion-implanted region 56A, thereby forming high-concentration N-type regions 56B.

Figure 25C:
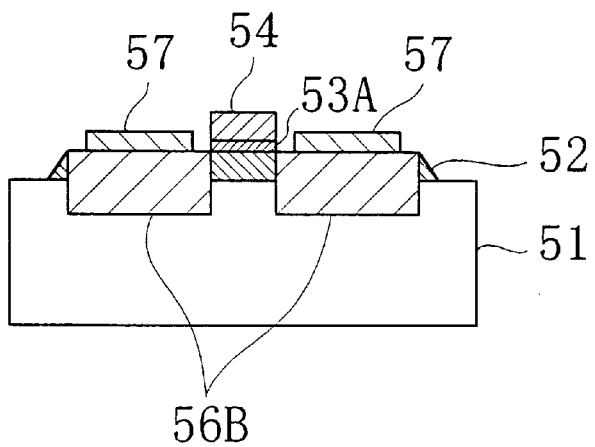
Figure 26A:
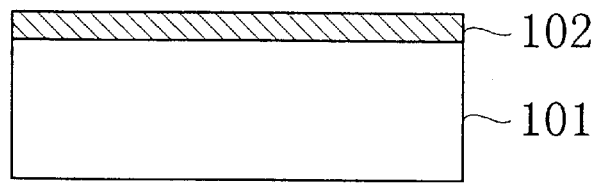
FIGS. 26(a) to 26(d) are cross-sectional views illustrating conventional process steps for manufacturing an HFET.
Figure 26B:
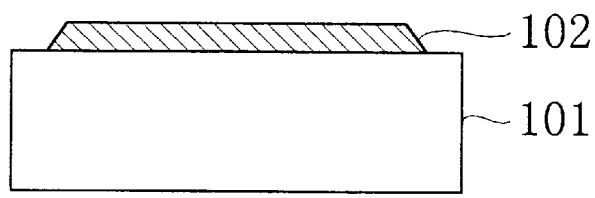
Figure 26C:
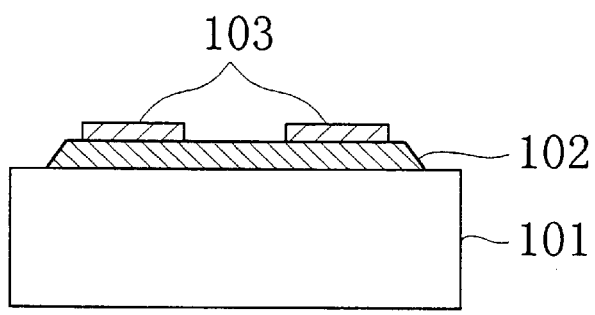
Figure 26D:
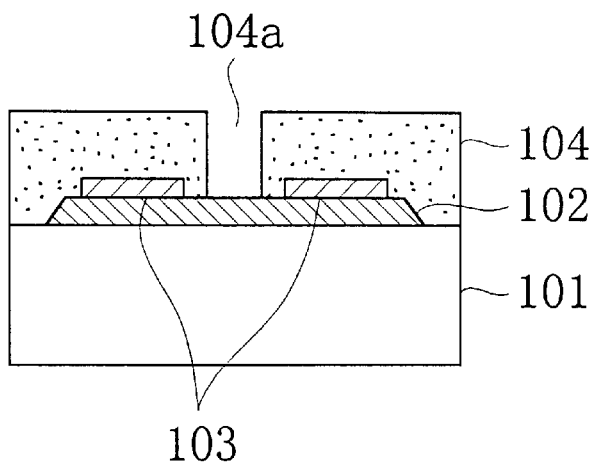
Figure 27A:
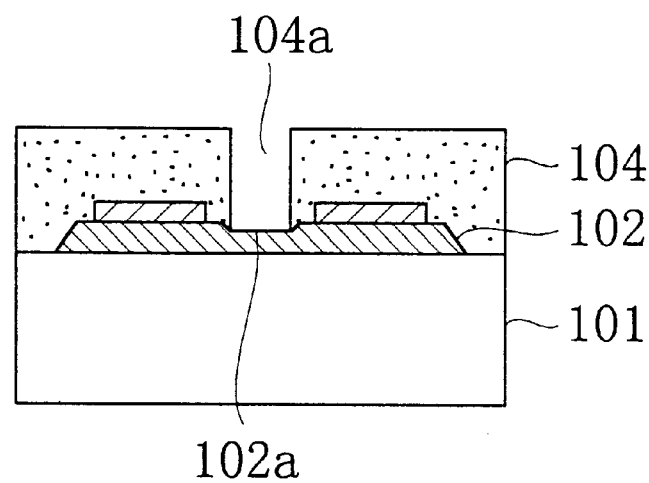
FIGS. 27(a) and 27(b) are cross-sectional views illustrating conventional process steps for manufacturing an HFET.
Figure 27B:
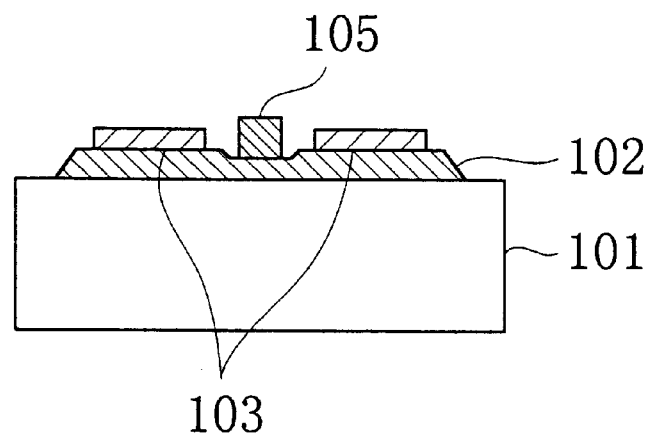

Next, as shown in FIG. 25(c), the protective film is removed and the ohmic electrodes 57, to be source/drain electrodes, are formed selectively on the high-concentration N-type regions 56B of the heterojunction epitaxial layer 52, whereby the manufacturing of the HFET is completed.

In this embodiment, since the P-type epitaxial layer 53A is provided between the heterojunction epitaxial layer 52 and 10 the gate electrode 54, the height φb of a Schottky barrier can be increased. Thus, a higher positive gate voltage can be applied. Consequently, the current drive capability can be increased by the application of a positive gate voltage and an operation using a single power source is realized.

Moreover, since the gate electrode 54 is formed without performing recess etching with respect to the heterojunction epitaxial layer 52, variations in the threshold voltages Vth of the HFETs can be minimized.

Furthermore, since the high-concentration N-type regions 56B are formed by adjusting the total film thickness of the AlGaAs layers composing the heterojunction epitaxial layer 52 at 50 nm or less and implanting ions into the heterojunction epitaxial layer 52, the sheet resistance Rs can be reduced.

In this embodiment, the hot-plate annealing process is performed for 30 seconds at a temperature of 750° C. Alternatively, the annealing process may be performed under such conditions as to increase the degree to which the high-concentration N-type regions 56B are activated, as long as the epitaxial structure in the region of the heterojunction epitaxial layer 52 under the gate electrode 54 is not destroyed.

In this embodiment, non-doped InGaAs is used in the well layer 12e in which carriers drift. Alternatively, non-doped GaAs may be used instead.

In this embodiment, the substrate is composed of InP. However, it is also possible to form a double heterostructure composed of InAlAs/InGaAs/InAlAs on a substrate composed of semi-insulating GaAs.

What is claimed is:

1. A semiconductor device comprising:
   a heterojunction epitaxial layer formed on a substrate;
   a gate electrode of a refractory metal formed on said heterojunction epitaxial layer; and
   source/drain regions formed in said heterojunction epitaxial layer, said source/drain regions being each formed of an impurity diffusion region in which impurity ions are diffused with high concentration,
   said source/drain regions including:

a first semiconductor layer comprising at least one layer containing aluminum, and a second semiconductor layer comprising at least one layer comprising no aluminum, wherein the total thickness of all layers of said first semiconductor layer containing aluminum equals 50 nm or less.

2. The semiconductor device of claim 1, further comprising a P-type epitaxial layer formed between said heterojunction epitaxial layer and said gate electrode.

3. The semiconductor device of claim 1, wherein said substrate is a semi-insulating GaAs substrate, said first semiconductor layer includes a carrier supplying layer composed of N-type AlGaAs, and said second semiconductor layer includes a well layer containing non-doped GaAs.

4. The semiconductor device of claim 1, wherein said substrate is selected from the group consisting of a semi-insulating InP substrate and a semi-insulating GaAs substrate, said first semiconductor layer includes a carrier supplying layer composed of N-type InAlAs, and said second semiconductor layer includes a well layer containing non-doped GaAs.

5. A semiconductor device comprising:

a heterojunction epitaxial layer formed on a substrate;

a gate electrode of a refractory metal formed on said heterojunction epitaxial layer; and source/drain regions formed in said heterojunction epitaxial layer, each of said source/drain regions being formed of an impurity diffusion region in which impurity ions are diffused with high concentration, said source/drain regions including:

a semiconductor layer comprising at least one layer containing aluminum, wherein the total thickness of all layers of said semiconductor layer containing aluminum equals 50 nm or less.

* * * * *